(12) United States Patent
Nakamura et al.

(10) Patent No.: US 12,183,708 B2
(45) Date of Patent: Dec. 31, 2024

(54) DOUBLE RESIST STRUCTURE FOR ELECTRODEPOSITION BONDING

(71) Applicant: International Business Machines Corporation, Armonk, NY (US)

(72) Inventors: Koki Nakamura, Kanagawa (JP); Toyohiro Aoki, Yokohama (JP); Takashi Hisada, Hachiouji (JP)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 17/588,404

(22) Filed: Jan. 31, 2022

(65) Prior Publication Data

US 2023/0245997 A1    Aug. 3, 2023

(51) Int. Cl.
*H01L 25/065* (2023.01)
*H01L 23/00* (2006.01)

(52) U.S. Cl.
CPC .............. *H01L 24/81* (2013.01); *H01L 24/19* (2013.01); *H01L 24/24* (2013.01); *H01L 24/73* (2013.01);
(Continued)

(58) Field of Classification Search
CPC ........ H01L 24/81; H01L 24/73; H01L 25/065
See application file for complete search history.

(56) References Cited

U.S. PATENT DOCUMENTS 9,508,594 B2  11/2016 Aoki
10,598,874 B2  3/2020 Aoki
(Continued)

FOREIGN PATENT DOCUMENTS

CN  103681556  3/2014
CN  104078431 B  2/2017
(Continued)

OTHER PUBLICATIONS

Sean Yang, et al. Development of Low-temperature, Presssureless Copper-to-Copper Bonding by Microfluidic Electroless Interconnection Process. 2018 IEEE 68th Electronic Components and Technology Conference. pp. 6.
(Continued)

*Primary Examiner* — Dale E Page
*Assistant Examiner* — Wilner Jean Baptiste
(74) *Attorney, Agent, or Firm* — Daniel Morris; Otterstedt & Kammer PLLC

(57) ABSTRACT

A semiconductor structure includes a wafer having a wafer outer surface; a semiconductor chip; and a plurality of copper pillars on the semiconductor chip. The pillars have curved end portions and pillar outside surfaces. Also included are a plurality of copper pads on the wafer. The pads have end portions aligned with the curved end portions of the plurality of copper pillars on the semiconductor chip, and the curved end portions of the plurality of copper pillars and the end portions of the plurality of copper pads define a plurality of bonding material receiving regions. The pads have pad outside surfaces. A copper bonding layer is on the pillar outside surfaces, the pad outside surfaces, the bonding material receiving regions, and portions of the outer surface of the wafer. The portions have an annular shape about the copper pads when viewed in plan.

16 Claims, 20 Drawing Sheets

(52) U.S. Cl.
CPC ...... *H01L 25/065* (2013.01); *H01L 2224/113* (2013.01); *H01L 2224/17104* (2013.01); *H01L 2224/19* (2013.01); *H01L 2224/215* (2013.01); *H01L 2224/81121* (2013.01)

(56) References Cited

U.S. PATENT DOCUMENTS

| | | | |
|---|---|---|---|
| 10,615,143 | B2 | 4/2020 | Aoki |
| 10,797,011 | B2 | 10/2020 | Aoki |
| 2004/0173375 | A1 | 9/2004 | Lee |
| 2008/0012116 | A1 | 1/2008 | Ko |
| 2008/0073795 | A1 | 3/2008 | Kohl |
| 2008/0093749 | A1 | 4/2008 | Gerber |
| 2010/0105173 | A1* | 4/2010 | Fujimori ............ H01L 24/12 257/E21.511 |
| 2010/0252440 | A1 | 10/2010 | Bonhote |
| 2014/0065771 | A1* | 3/2014 | Gruber ............ H05K 3/3436 257/E21.506 |
| 2014/0376200 | A1 | 12/2014 | Uzoh |
| 2015/0001706 | A1 | 1/2015 | Mirpuri |
| 2015/0021767 | A1 | 1/2015 | Park |
| 2015/0348925 | A1 | 12/2015 | Surdock |
| 2016/0141229 | A1 | 5/2016 | Paek |
| 2016/0211206 | A1 | 7/2016 | Lee |
| 2020/0043816 | A1 | 2/2020 | Liu |
| 2023/0317652 | A1 | 10/2023 | Aoki |

FOREIGN PATENT DOCUMENTS

| | | |
|---|---|---|
| CN | 111199946 | 5/2020 |
| CN | 113314428 | 8/2021 |
| JP | 2006294761 | 10/2006 |
| JP | 2007036022 | 2/2007 |
| JP | 2007036022 A | 2/2007 |

OTHER PUBLICATIONS

Tyler Osborn, et al., Electroless copper deposition with PEG suppression for all-copper flip-chip connections. Journal of The Electrochemical Society, 2009, pp. 5.

Kohki Nakamura, et al., Low Temperature Bonding of Copper by Electrodeposition, 2021. pp. 5 Symposium on Microjoining and Assembly Technology in Electronics 2021 (vol. 27, pp. 257-261). (Japanese with English abstract).

Multilayer Circuit Fabrication using Double Exposure of Positive Resist. Published Date: Oct. 1, 1993. pp. 3 Exposure MC. of Positive Resist. IBM Technical Disclosure Bulletin. Oct. 1993;36(10):423.

Ideas & Innovation. Copper pillar electroplating tutorial by Lucy Wei Downloaded from https://www.dupont.com/electronic-materials/blogs/knowledge/copper-pillar-electroplating-tutorial.html on Jan. 26, 2022, pp. 6.

Toyohiro Aoki, Novel Low Cost Bumping Process with Non-strip Type Photosensitive Resin and Injection Molded Solder (IMS) for Fine Pitch Flip Chip Joining. 2016 IEEE 66th Electronic Components and Technology Conference May 31, 2016 (pp. 413-419). IEEE.

International Search Report and Written Opinion dated Jun. 28, 2023, for International Application No. PCT/182023/051508, filed Feb. 19, 2023.

European Patent Office as ISA, Authorized officer CAMPS, Ester, related PCT application PCT/EP2023/050473, mailed on May 8, 2023. Provisional Opinion Accompanying the Partial Search Result. pp. 17.

European Patent Office as ISA, Authorized officer Maslankiewicz, Pawel, related PCT application PCT/EP2023/050473, mailed on Jun. 30, 2023. ISR & WO. pp. 26.

Taiwan Intellectual Property Bureau, Ministry of Economic Affairs. Notice of Exam Report on related Taiwan case 11220959350, mailed on Sep. 23, 2023. pp. 7. In traditional Chinese with English reference category characterization on p. 6.

Taiwan Intellectual Property Bureau, Ministry of Economic Affairs. Notice of Allowance on related Taiwan case 11220959350, mailed on Nov. 16, 2023. pp. 6. In traditional Chinese.

\* cited by examiner

DOUBLE RESIST STRUCTURE FOR ELECTRODEPOSITION BONDING

BACKGROUND

The present invention relates generally to the electrical, electronic and computer arts and, more particularly, to integrated circuits and the like.

Bonding processes for chips on wafers generally use solder joints or solid phase diffusion bonding of copper. These bonding processes are conducted at over 150 degrees C., causing the silicon wafer to be warped because of thermal effects. To reduce the effect of heat, electrodeposition bonding, wherein metal is precipitated at a much lower temperature than 150 degrees C., is useful.

Conventional techniques for deposition bonding employ electroless copper deposition. The joints are completed by filling the gaps between facing copper pads with electroless copper or nickel. However, the strength of electroless copper bonding is low, and solid phase diffusion bonding is required. While nickel electroless deposition can fabricate better joints than copper, the bonding temperature is as high as 80 degrees C. In addition, the bonding time is much longer than 0.5 hours because the electroless deposition rate is low.

On the other hand, electrodeposition has a higher growth rate than electroless deposition and produces better mechanical properties than electroless deposition. The bonding of copper rods (1 μmm to 5 μmm diameter) by copper electrodeposition at room temperature, similar to a Damascene process, has been developed, and the shear strength of copper electrodeposition bonding is close to that of the copper base material without diffusion phase bonding.

BRIEF SUMMARY

Principles of the invention provide techniques for a double resist structure for electrodeposition bonding. In one aspect, an exemplary semiconductor structure includes a wafer having a wafer outer surface; a plurality of copper pillars on a semiconductor chip, the plurality of copper pillars having pillar end portions and pillar outside surfaces; a plurality of copper pads on the wafer, the pads having pad end portions aligned with the pillar end portions, the pillar end portions and the pad end portions of the plurality of copper pads defining a plurality of bonding material receiving regions, the pads having pad outside surfaces, at least one of the pillar end portions and the pad end portions being curved; and a copper bonding layer on the pillar outside surfaces, the pad outside surfaces, the bonding material receiving regions, and portions of the outer surface of the wafer, the portions of the outer surface of the wafer surrounding the copper pads when viewed in plan.

In another aspect, an exemplary method of forming a semiconductor structure includes providing a first substrate; providing a first seed layer on an outer surface of the first substrate; forming a patterned first resist layer on the first seed layer; and forming a patterned second resist layer on the patterned first resist layer. When viewed in plan, the first resist layer and the second resist layer have aligned openings, and the openings in the second resist layer are smaller than the openings in the first resist layer. The method further includes depositing first copper onto the first seed layer in the openings in the second resist layer; removing the second resist layer to reveal the deposited first copper as a plurality of first copper structures; providing a second substrate with a plurality of second copper structures; and aligning the first copper structures with the second copper structures. The method still further includes electrodepositing a copper layer on outside surfaces of the first copper structures, outside surfaces of the second copper structures, bonding material receiving regions defined between the aligned first and second copper structures, and portions of the first seed layer on the outer surface of the first substrate. The portions of the first seed layer on the outer surface of the first substrate surround the copper first copper structures when viewed in plan.

In a further aspect, a hardware description language (HDL) design structure is encoded on a machine-readable data storage medium. The HDL design structure includes elements that when processed in a computer-aided design system generate a machine-executable representation of at least a portion of a semiconductor structure, as described.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:
 avoiding formation of scallop-shaped joints as in nickel electroless deposition;
 limiting copper deposition to only the copper pads by virtue of a first mask remaining in place;
 ability to prevent decreasing of the conduction area by undercutting (does not occur when the seed layer is etched);
 permits use of electrodeposition bonding, so that:
  copper pads can be joined at low temperature, and a joint with low electrical resistivity and small heat capacity can be formed;
  even if there are height variations, the growth of the plating will ultimately achieve bonding;
  if electroless nickel and gold plating is fabricated on the surface of joints, prevention of corrosion and/or oxidation can be facilitated.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
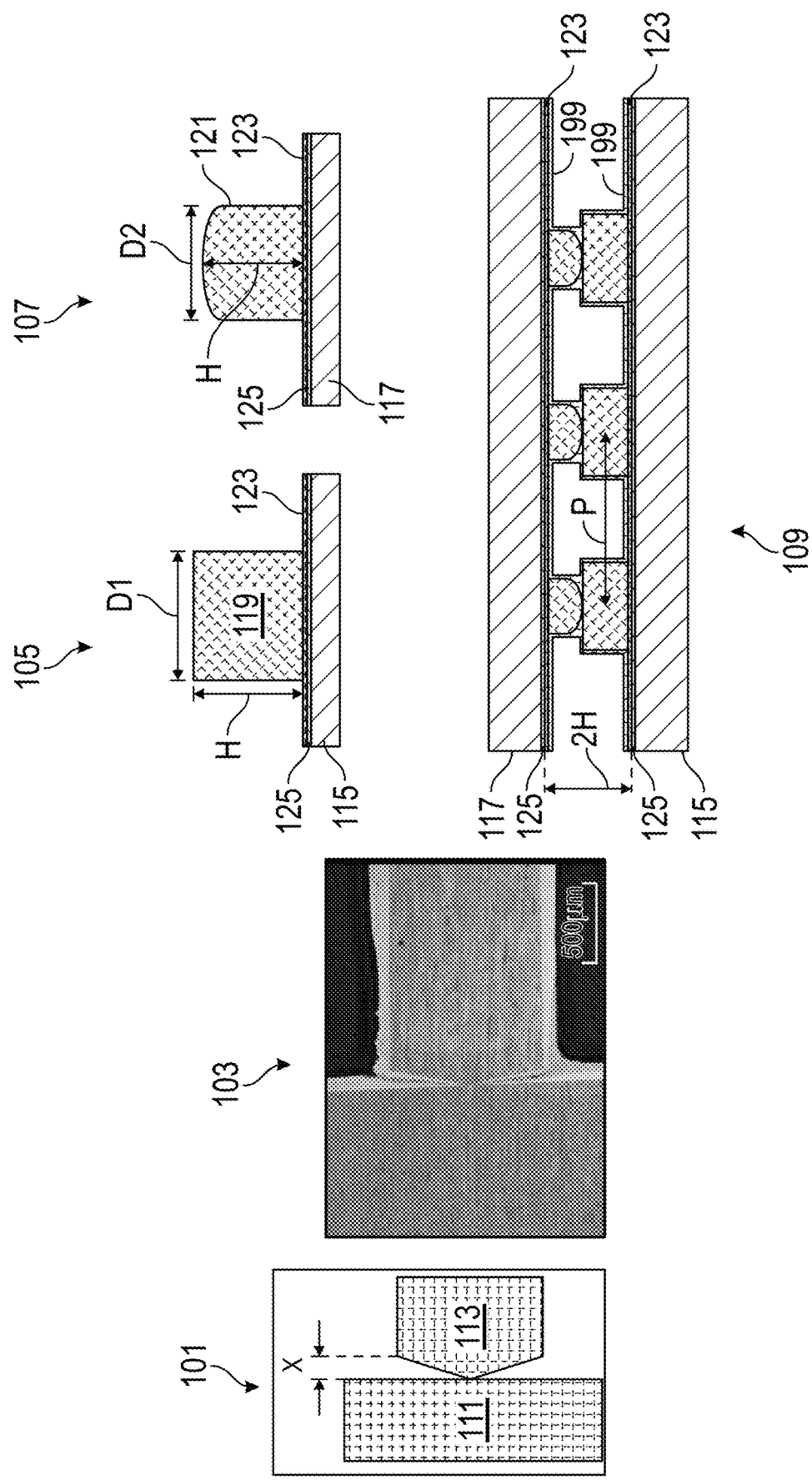
FIG. 1 shows aspects of a bonding process with electrodeposition, according to an aspect of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Direct bonding of copper to copper is attractive as a bonding process for chip on wafer bonding or chip to interposer (silicon, glass, organic) bonding, from the perspective of providing good resistivity and not containing intermetallic compounds. Solid phase diffusion bonding requires high pressurization, a controlled atmosphere, and high temperature bonding (over 200° C.). Ultrasonic bonding can be carried out at lower temperatures than thermal compression bonding (room temperature); however, this is at the cost of reduced joint strength.

Electrodeposition bonding, where metal is precipitated without pressurization at low temperature, will be useful for bonding processes for chips on wafers from the perspective of low temperature bonding and the possibility of high strength and good resistivity. Conventional deposition bonding is carried out by filling the gaps between facing copper pillars with electroless deposition metal. Copper electroless deposition bonding is carried out at an annealing temperature of about 180° C. The strength of electroless copper bonding is low, so that when higher strength is needed, solid phase diffusion bonding at 250° C. is appropriate. For nickel electroless deposition, the bonding temperature is as high as 80° C., and the characteristics of the nickel joint are inferior compared with copper (as compared to copper, nickel has a higher Young's modulus, higher electrical resistivity, and lower thermal conductivity). In general, it is difficult for electroless deposition metal to grow uniformly.

This electrodeposition bonding process is completed by filling electrodeposition metal into the gap between the copper pillar of the chip side and that of the wafer side. To complete this electrodeposition bonding, it is typically necessary to coat the entire surface of the wafer with a seed layer. However, it is difficult to etch the seed layer, because metal is also deposited on the seed layer when electrodeposition is conducted. Furthermore, the etching rate may be different inside and outside and the undercut problem will become more serious because it is necessary to pour the etching solution into a very narrow gap (in this context, regarding "inside" and "outside," reference is made to the gap between the chip and the substrate. "Inside" is near the center of the chip, and "outside" is along the periphery of the chip).

Referring now to FIG. 1, consider a bonding process with electrodeposition. Bonding of copper rods by copper electrodeposition exhibits behavior similar to Damascene processes at room temperature (25° C.) without pressurization. The shear strength is close to that of the copper base material, without diffusion phase bonding. We expect that electrodeposition bonding is useful for a bonding process for chip on wafer, from the perspective of low temperature bonding, possibility of high strength, and good resistivity. It is typically necessary to coat the entire surface of the wafer with a seed layer. Furthermore, it is difficult to etch the seed layer because copper is also deposited on the seed layer, and it is thus necessary to pour the etching solution into a very narrow gap. The etching rate may be different inside and outside and the undercut problem will become more serious.

In FIG. 1, view 101 shows a schematic of bonding of copper rods 111, 113 by electro copper deposition; view 103 shows a photomicrograph of such bonding; view 105 shows a copper pad 119 without curvature on the top for a chip on wafer application, view 107 shows a copper pillar 121 with curvature on the top for a chip on wafer application, and view 109 shows the structures of views 105 and 107 joined together. Note silicon substrates 115, 117. Rod 111 could have, for example, a diameter of about 5 µmm, rod 113 could have, for example, a diameter of about 1 µmm, and distance x could be, for example, about 100 µm. Non-limiting exemplary values for other dimensions include about 30 µm for D1, about 20 µm for D2, about 30 µm for H, and about 80 µm for the pitch, P. Note the electrodeposited copper material 199 and the seed layer (e.g., copper 123 and titanium 125).

Figure 2A:
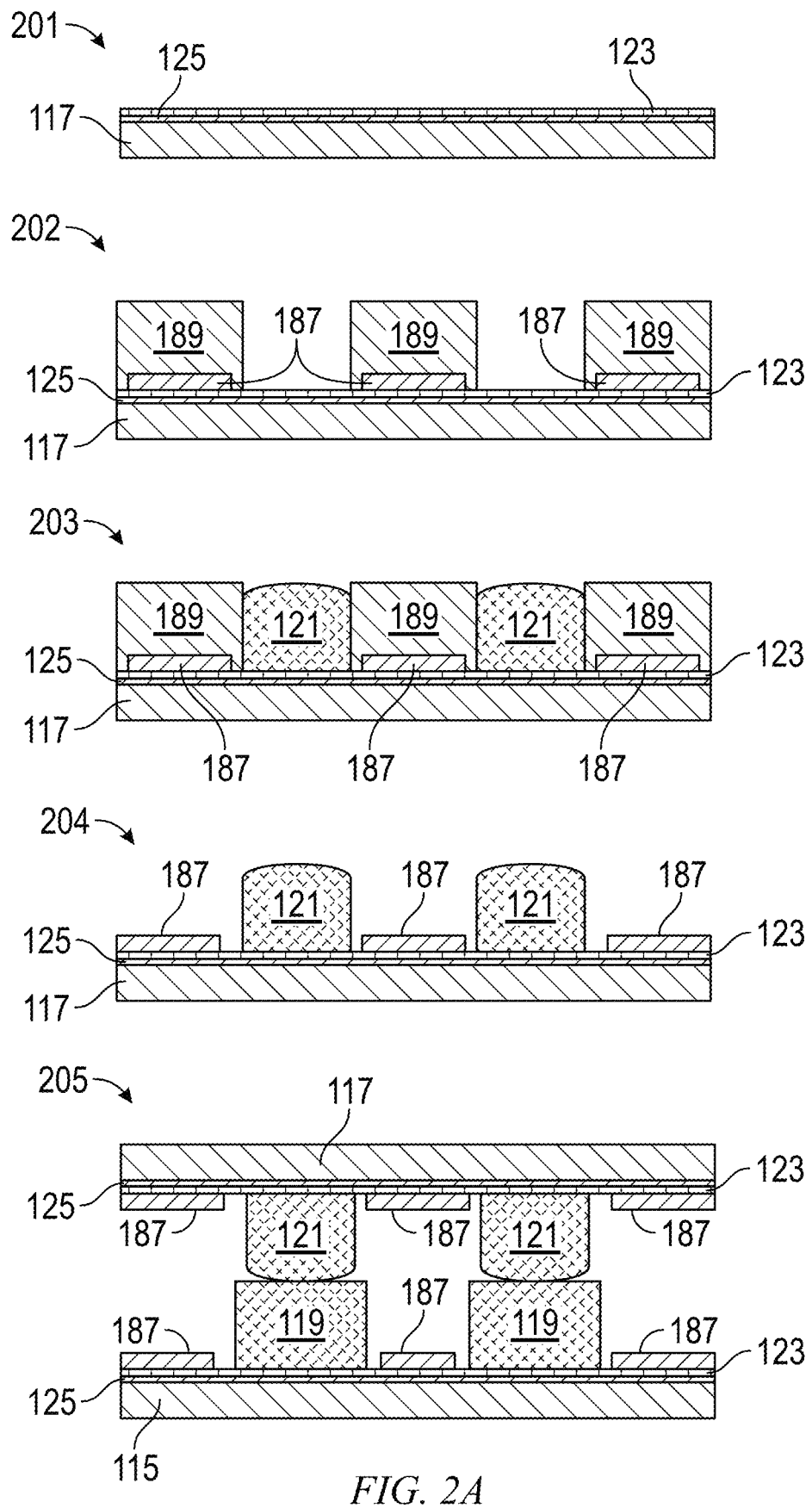
FIGS. 2A and 2B show an exemplary process flow, according to aspects of the invention.
Figure 2A:
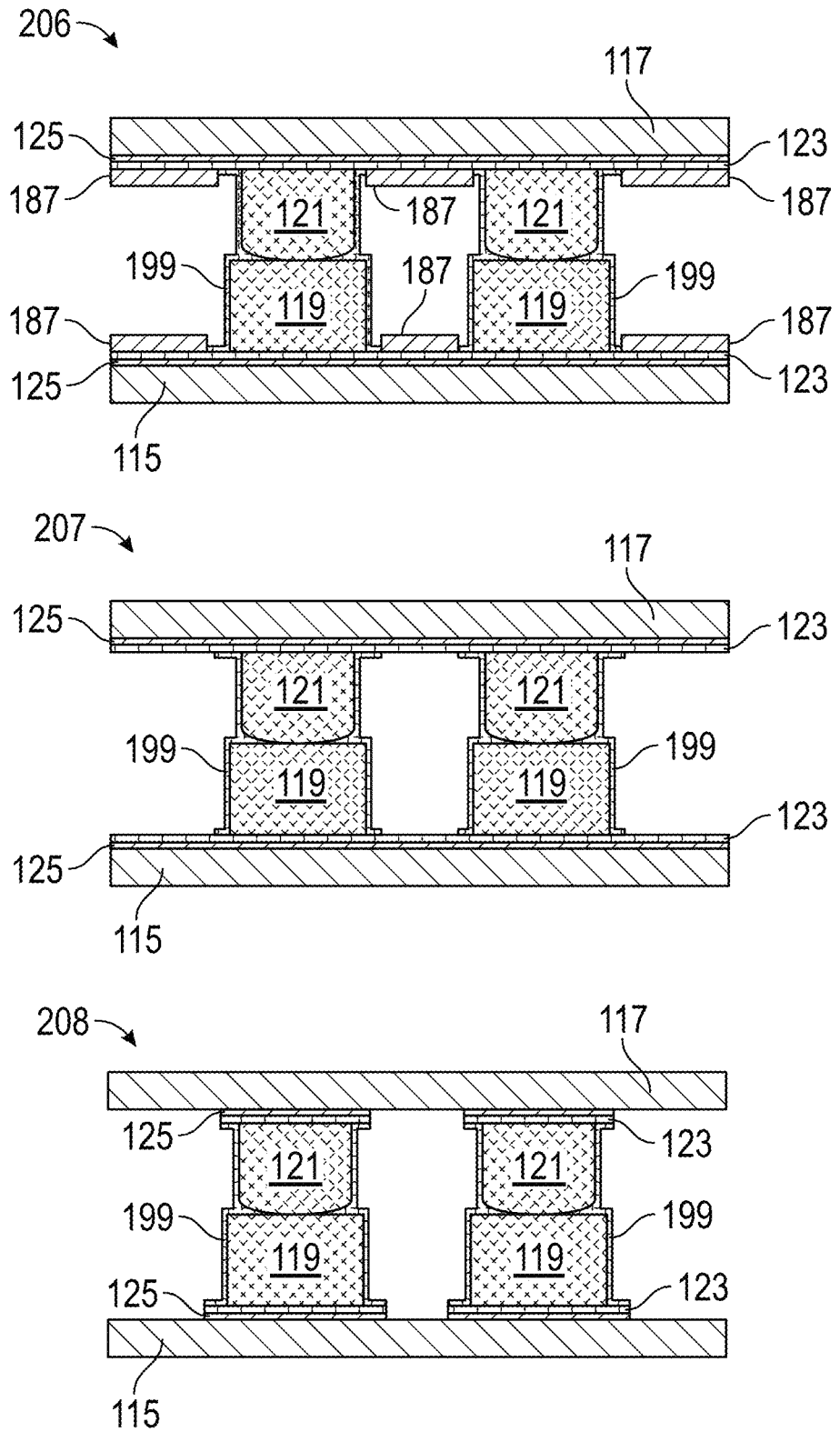
Figure 2B:
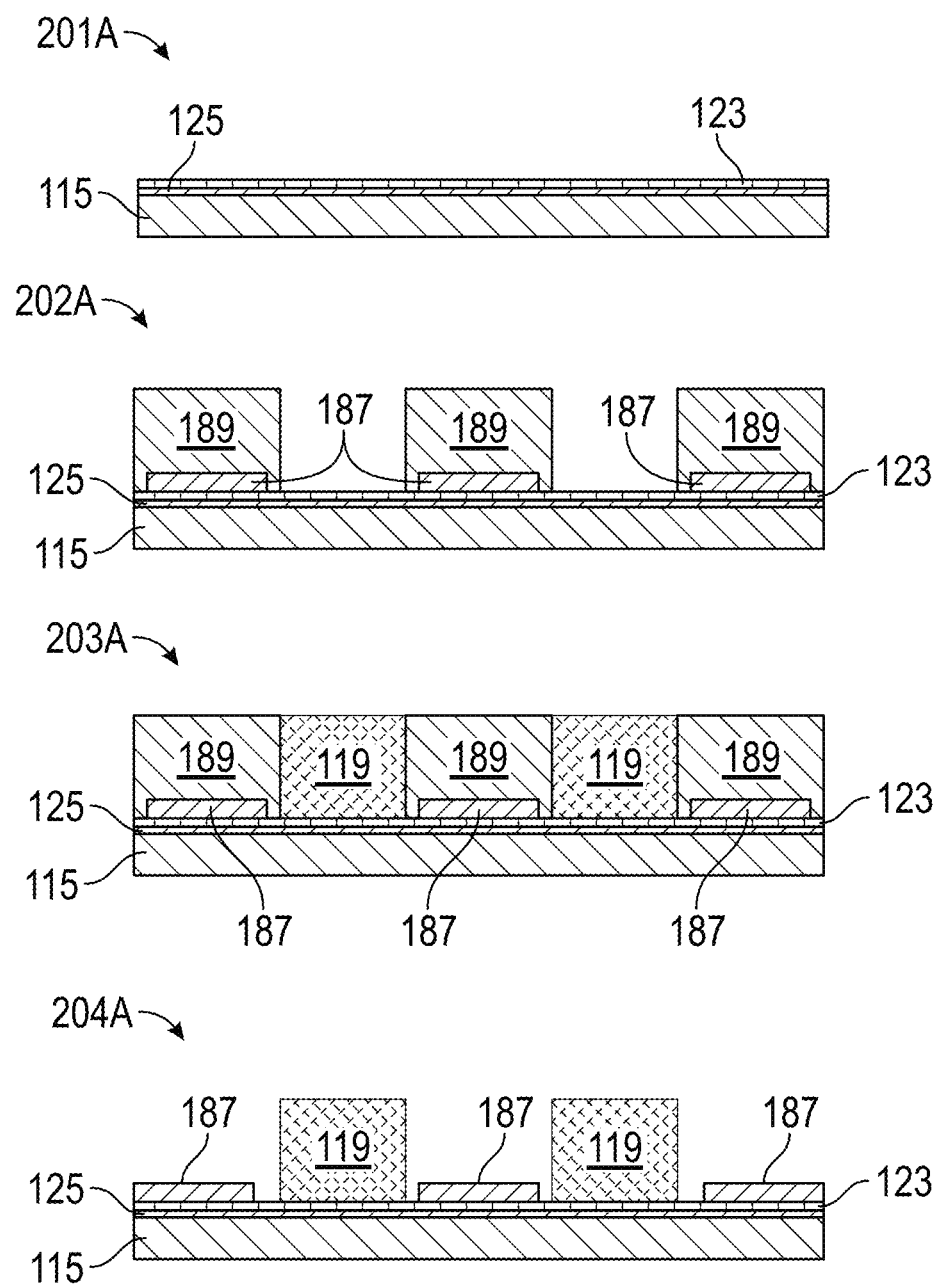

FIGS. 2A and 2B show an exemplary process flow, according to aspects of the invention. In a first step shown at 201, form the seed layer (e.g., copper 123 and titanium 125) on the substrate 117 (materials 123, 125 can be sputtered, for example). In a second step shown at 202, use conventional photolithographic techniques to deposit and expose a double resist including a first resist material 187 and a second resist material 189. In a third step shown at 203, form the copper pillars 121 on the seed layer in the gaps between the resist material. In a fourth step shown at 204, remove the second resist 189 (for example, at a temperature of about 20 to 30° C.). Note that steps 201-204 have been shown for the substrate 117 and pillars 121 with tops having curvature, but are essentially (see discussion of FIG. 2B below and note also that curved or flat pads/pillars are made by using different electrodeposition solutions, as will be appreciated by the skilled artisan) equally representative of formation of the pads 119, with tops that do not have curvature, on the substrate 115. For convenience, rods/ structures on the wafer are referred to as pads and rods/ structures on the chips are referred to as pillars.

In a fifth step shown at 205, align the chip and the wafer. In a sixth step shown at 206, carry out electrodeposition of material 199 (for example, at a temperature of about 20 to 30° C.). In a seventh step shown at 207, remove the first resist 187 (for example, at a temperature of about 40° C.). In an eighth step seen in view 208, remove the seed layer 123, 125 (except under the pads/pillars 119, 121 and the material 199). This can be done, for example, at a temperature of about 20 to 40° C.

Referring now to FIG. 2B, consider formation of the pads 119, with tops that do not have curvature, on the substrate 115. In a first step shown at 201A, form the seed layer (e.g., copper 123 and titanium 125) on the substrate 115 (materials 123, 125 can be sputtered, for example). In a second step shown at 202A, use conventional photolithographic techniques to deposit and expose a double resist including a first resist material 187 and a second resist material 189. In a third step shown at 203A, form the copper pads 119 on the seed layer in the gaps between the resist material. In a fourth step shown at 204A, remove the second resist 189 (for example, at a temperature of about 20 to 30° C.).

Figure 3:
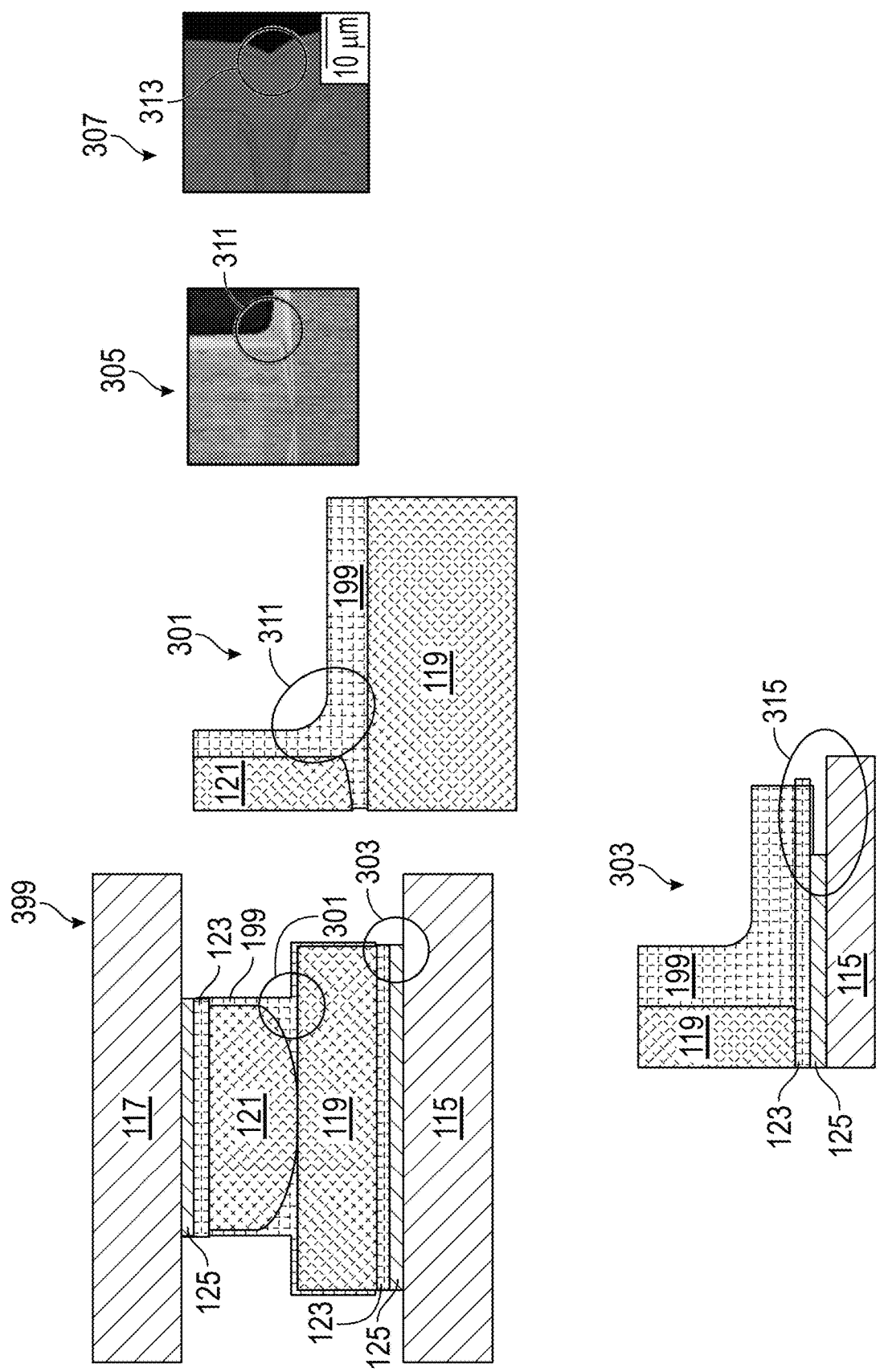
FIG. 3 shows aspects of structures of a copper deposition joint for reducing concentration of stress and retaining conduction area, according to aspects of the invention.

Referring now to FIG. 3, consider aspects of the structure of the copper deposition joint for purposes of reducing concentration of stress and leaving adequate remaining conduction area. In one or more embodiments, this structure is fabricated by copper electrodeposition without use of electroless deposition. View 399 is an enlarged detail of view 208. View 301 (boundary between the copper pillars/ pads) shows an enlarged view of portion 301 in view 399. It can be seen that a smooth fillet forms in the material 199, as seen at 311 in views 301 and 305 (the latter being a photomicrograph of copper electrodeposition). It is instructive to compare views 301 and 305 to view 307, showing nickel electroless deposition forming a scalloped region 313 which causes undesirable stress concentration. Advantageously, smooth fillet region 311 does not increase stress as does region 313. View 303 shows details of the bottom of the copper pad 119 (an enlarged view of portion 303 in view 399). As seen at 315, the deposition area is wider than the actual copper pad diameter, such that decreasing the conduction area by undercut does not occur; i.e., even though layer 125 is laterally recessed, it still extends beyond the outer diameter of the copper pad 119. Similar beneficial effects with respect to undercutting will also be expected with the pillars 121.

Figure 4:
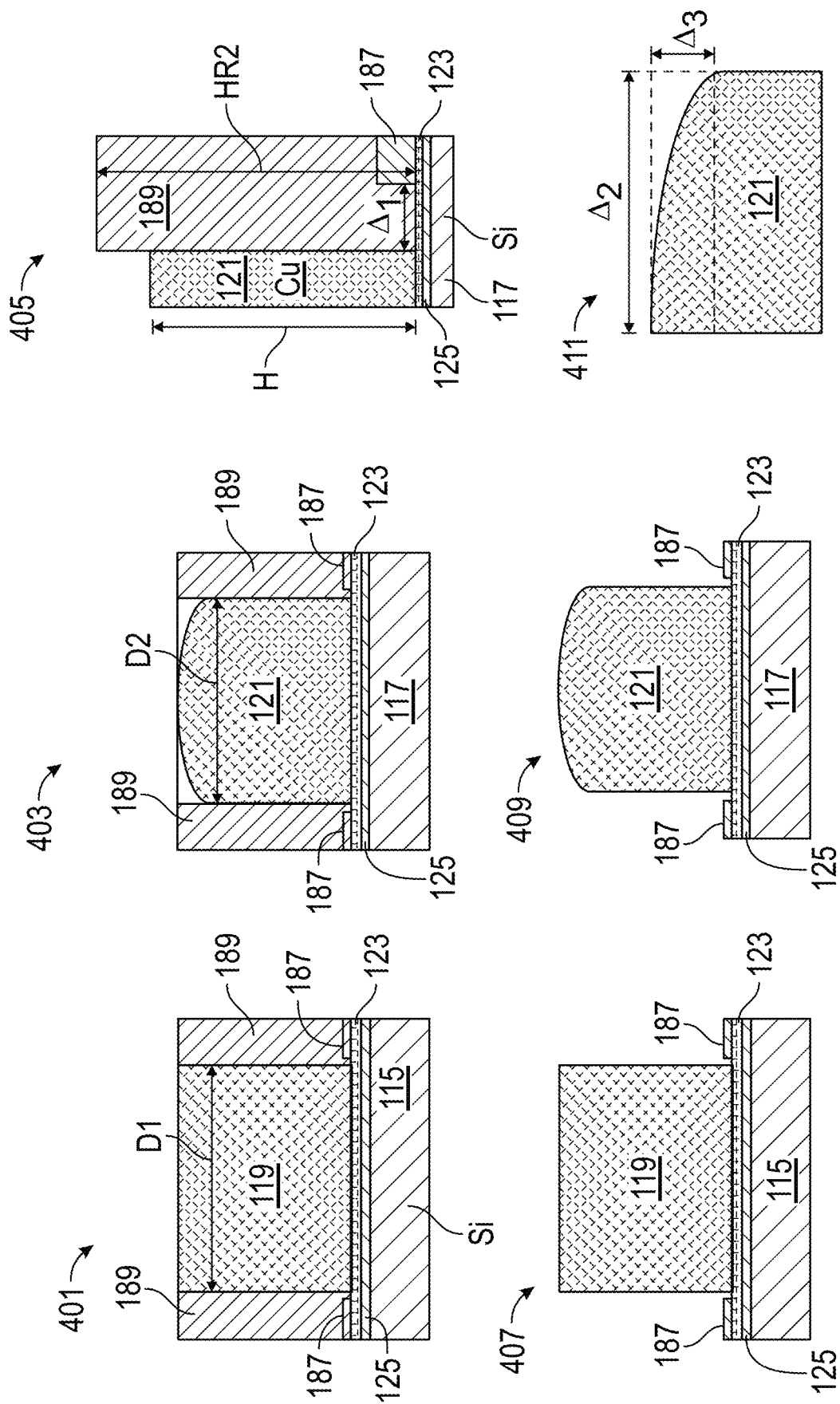
FIG. 4 shows aspects of double mask resists for copper pad/pillar formation, according to aspects of the invention.

FIG. 4 shows exemplary details to achieve the advantageous structural features discussed with respect to FIG. 3, including the use of two different mask resists for copper pad/pillar formation. In one or more embodiments, the two types of resist are stripped with different stripping liquids. The resist materials are coated on the sputtered seed layers. The copper 199 is deposited only on the copper pads/pillars 119, 121 and those portions of the seed layer where the resist has been removed.

In FIG. 4, views 401, 403, and 405 show details before removal of the second resist 189. View 405 shows the periphery of copper pillar 121 but is also representative of pad 119. The height $H_{R2}$ of the second resist layer can be about 40 μm, for example. The dimension $\Delta_1$ can be, for example, about 5 μm. The thickness of the first resist layer 187 can be, for example, about 5 μm. The thickness of the sputtered Ti portion of the seed layer 125 can be about 0.05 μm and the sputtered Cu portion of the seed layer 123 can be about 0.3 μm.

In FIG. 4, views 407, 409, and 411 show details after removal of the second resist 189. View 411 shows an example of the curvature of the copper pillar 121. For example, the dimension $\Delta_2$ can be about 10 μm and the dimension $\Delta_3$ can be about 2 μm. Similar proportions could be used for curved pads if desired.

Figure 5:
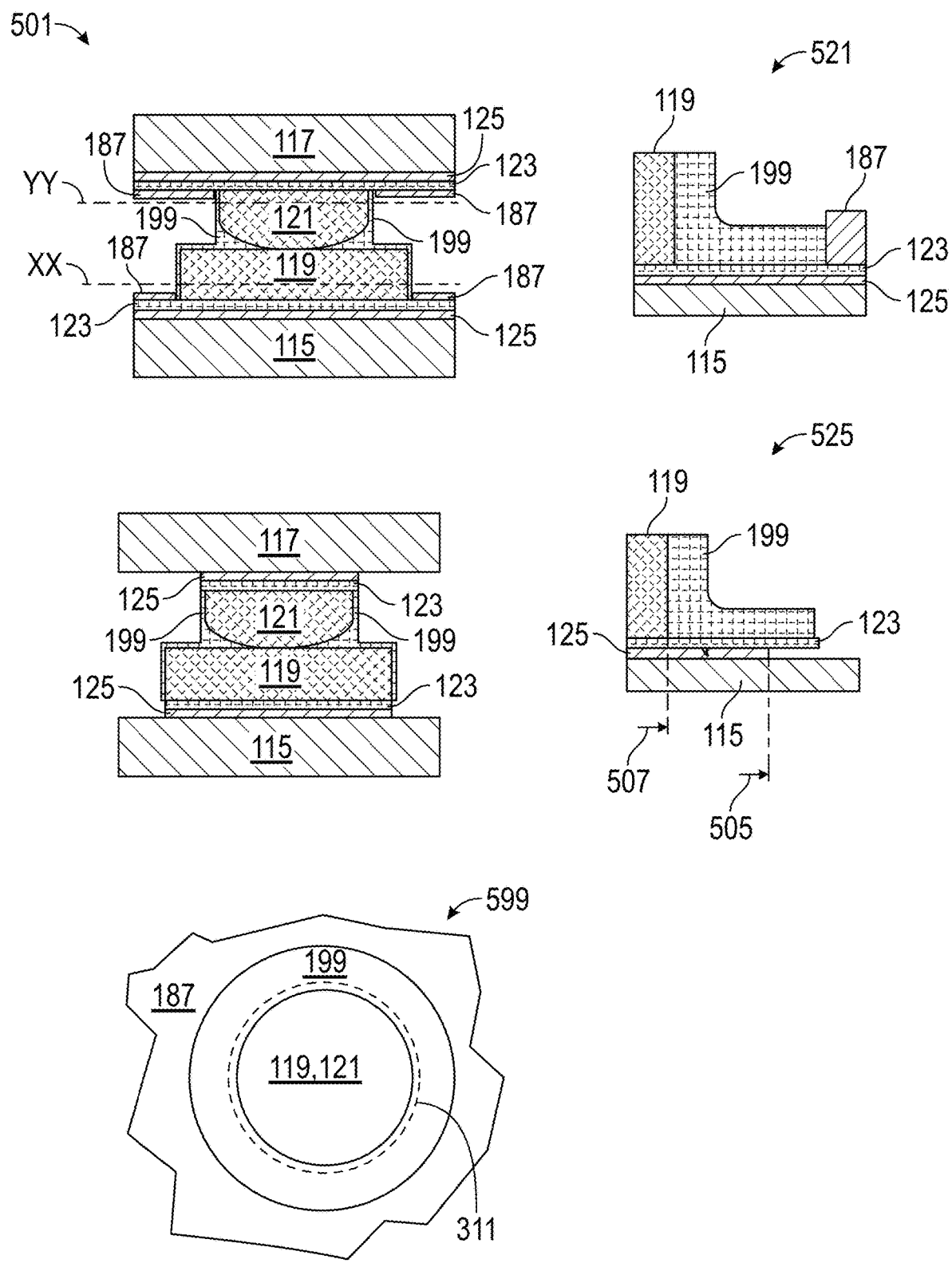
FIG. 5 shows details of different sized resist openings, according to aspects of the invention.
Figure 5:
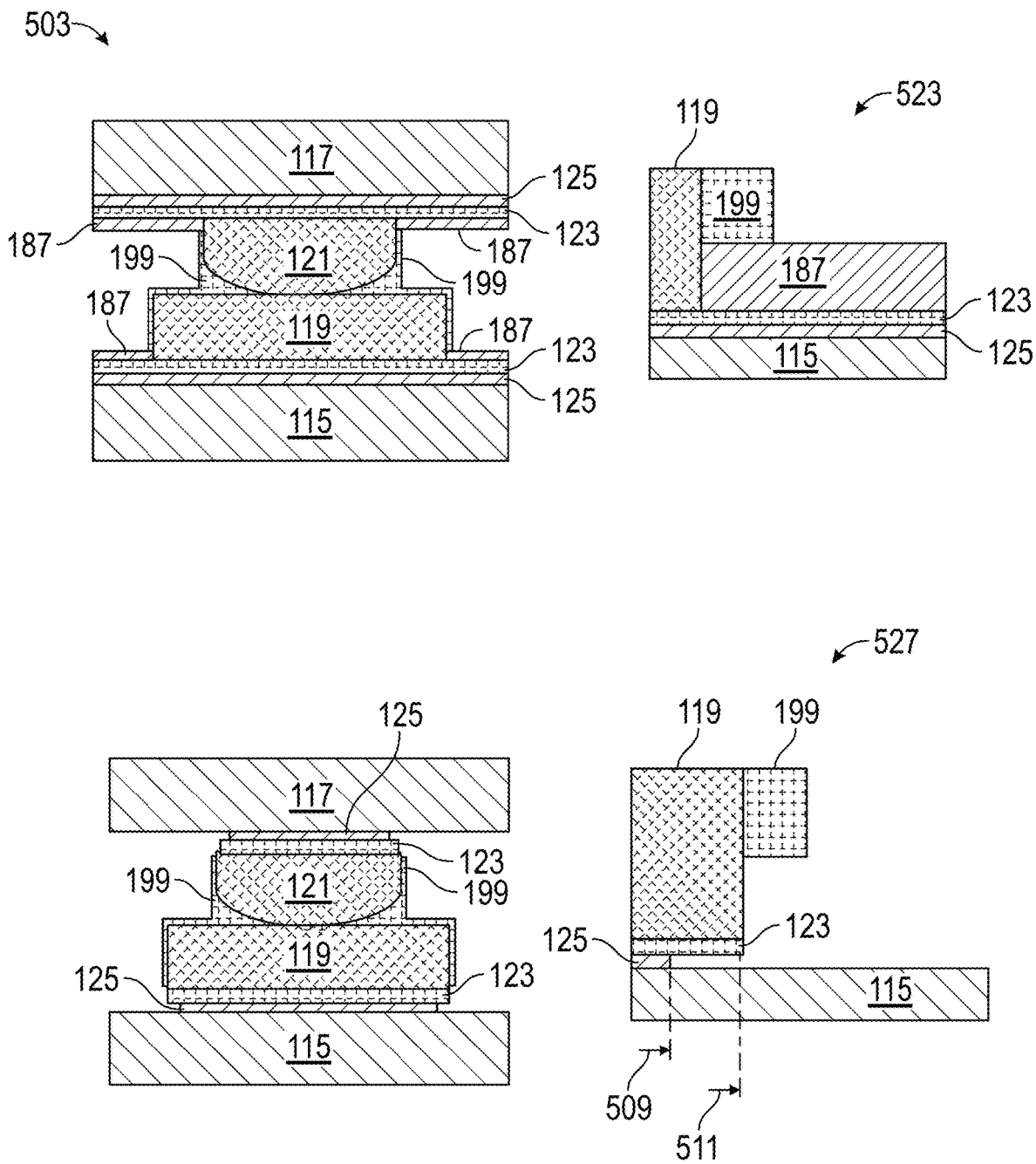

Referring now to FIG. 5, the opening in the two resists can be the same, as shown in the right-hand view 503, or can be different, as shown in the left-hand view 501, where the opening in the first resist 187 is larger than that in the second resist 189. In each of views 501, 503, the top row shows the bonding process and the bottom row shows the process of stripping the resist and etching the seed layers. Each of views 521, 523, 525, 527 are details of the corresponding interplay between the electrodeposited material 199, pad 119, seed layer 123, 125, and first resist 187. Note at 521 how the material 199 fills the region between the first resist 187 and the pad 119. Note at 525 the pad area 507 and conduction area 505. On the other hand, note at 523 how the first resist 187 abuts the pad 119 while material 199 is outward of the first resist 187 and also abuts the pad 119 (details shown in FIG. 5 for the pads 119 can be similar for the pillars 121). Note at 527 the pad area 511 and conduction area 509. It can be seen that in view 501, after the second resist 189 is stripped, a gap is present between the copper pads/pillars 119, 121 and the first resist 187. Copper 199 is also deposited in the gap between the copper pads/pillars and the first resist. Comparing view 525 to view 527, in the approach 501, there is no decrease in the conduction area 505 by undercutting (i.e., conduction area is larger than pad area). Undercutting is seen in the approach 503 (i.e., conduction area is smaller than pad area—layer 125 is laterally recessed so far that it is within the outer diameter of the copper pad 119). View 599 is an in-plan view representing the view down along line XX or up along line YY in view 501; the size of the annular region (between 119 or 121 and resist 187) filled with material 199 is exaggerated for clarity. Note the fillet 311.

Figure 6:
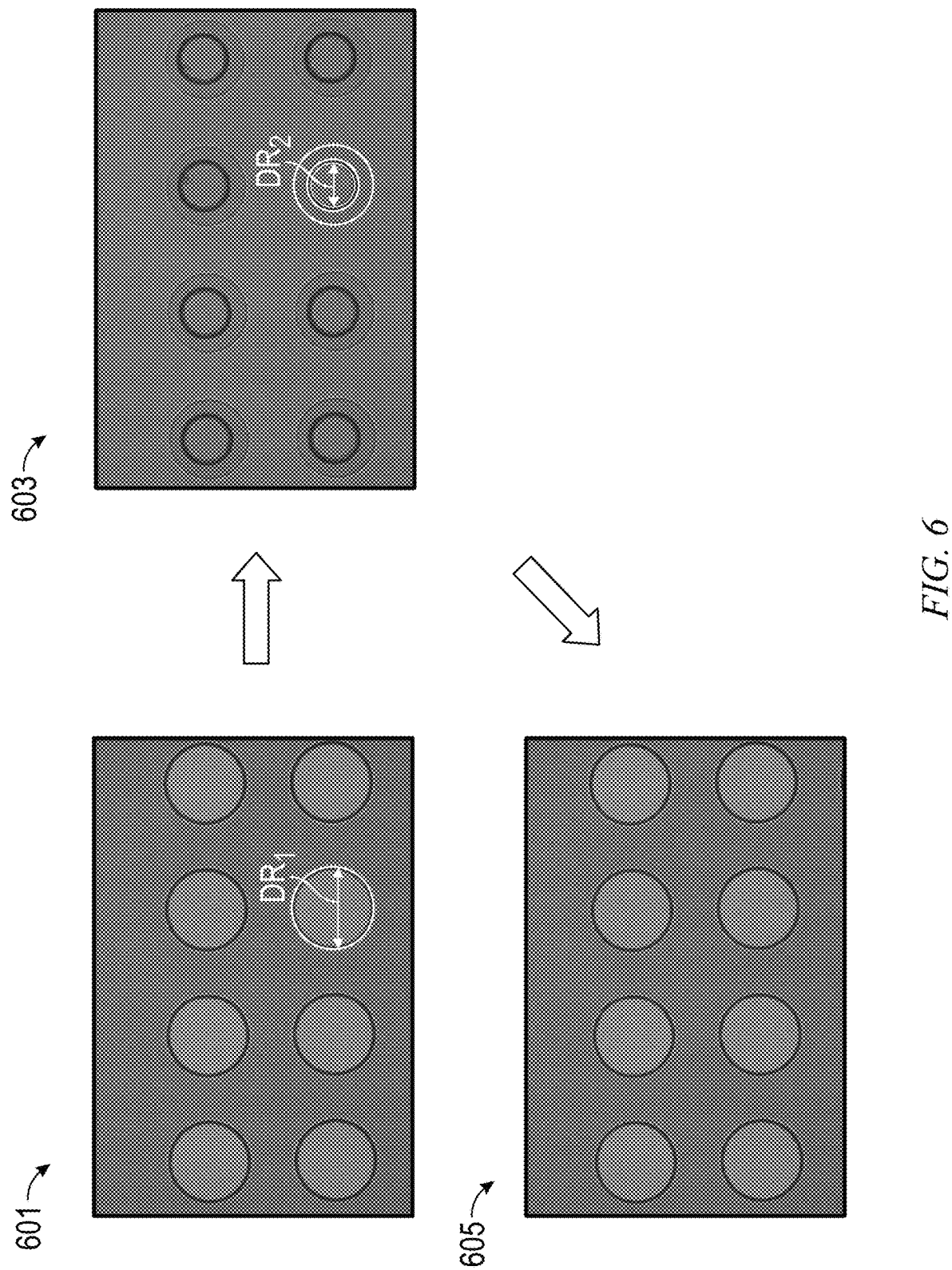
FIG. 6 shows details of selective resist stripping, according to aspects of the invention.

FIG. 6 presents additional details regarding selective stripping of the first layer of resist 187. In a non-limiting example, the first resist is a negative resist and the second resist is a positive resist. Commercially available resists can be employed as will be familiar to the skilled artisan; for example, such as are available from JSR Corporation of Tokyo, Japan and TOKYO OHKA KOGYO CO., LTD. (TOK) 150 Nakamaruko, Nakahara-ku, Kawasaki-shi, Kanagawa Prefecture 211-0012 Japan. Non-limiting examples include JSR ELPAC JJ-s116R-800 and PMER P-WG300; in general, two resists that are removable with different solvents can be employed. View 601 shows a top view of the first resist after cure. In this non-limiting example, the thickness of the first resist is 2.86 μm and the diameter $D_{R1}$ is about 90 μm. View 603 shows the first resist with the second resist over it. In this non-limiting example, the thickness of the second resist is 6.06 μm and the diameter $D_{R2}$ is about 60 μm; good patterning is achieved. View 603 shows the result after stripping the second resist (for example, via exposure to acetone for about one minute). The first resist can be removed, for example, via an appropriate resist removal solution available from the resist manufacturer, depending on what resist is used, at 40° C. for 10 minutes. The thickness of the first resist after removal of the second resist is, in this example, about 2.80 μm. It is thus, advantageously, possible to coat the two resist layers and strip only the second resist. See FIG. 2A views 203 and 204.

Figure 7:
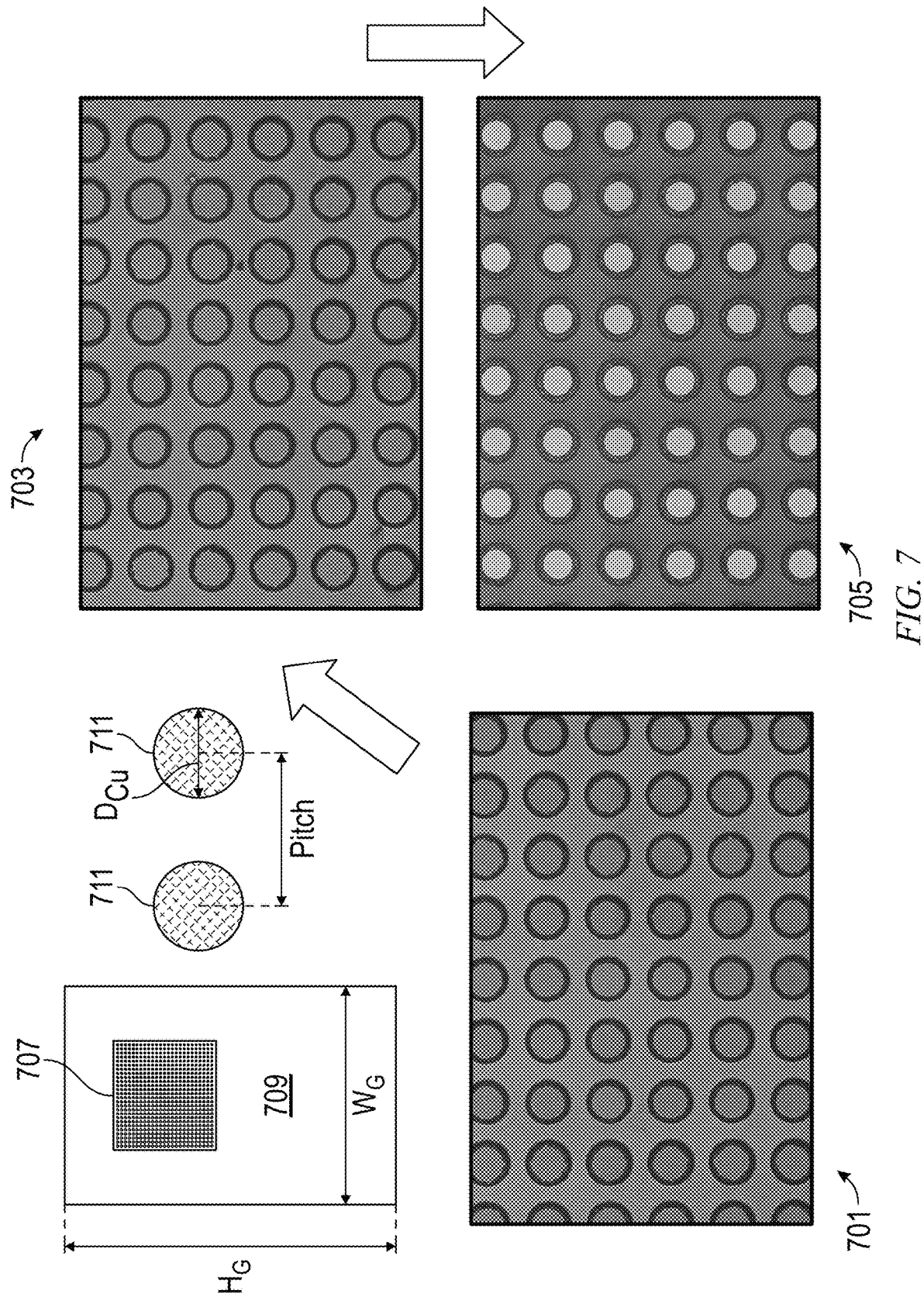
FIG. 7 shows details of barrier layer etching, according to aspects of the invention.

FIG. 7 presents additional details regarding etching of the seed layer (in a non-limiting example, for a 4 μmm square chip 707). In particular, note glass chip 707 bonded on glass substrate 709 (for example, $W_G$=10 μmm and $H_G$=15 μmm). In the example, the seed layer of the top chip (e.g., 117 as discussed above) is already etched, and the gap between the chip and substrate is about 45 μm. The pitch between the copper pads 711 can be about 150 μm and the diameter $D_{Cu}$ can be about 85 μm. View 701 is a top view before etching—see view 207. View 703 is a top view after etching of the copper 123 (e.g., about 6 minutes). View 705 is a top view after etching of the titanium 125 (e.g., about 3 minutes)—see view 208.

Figure 8:
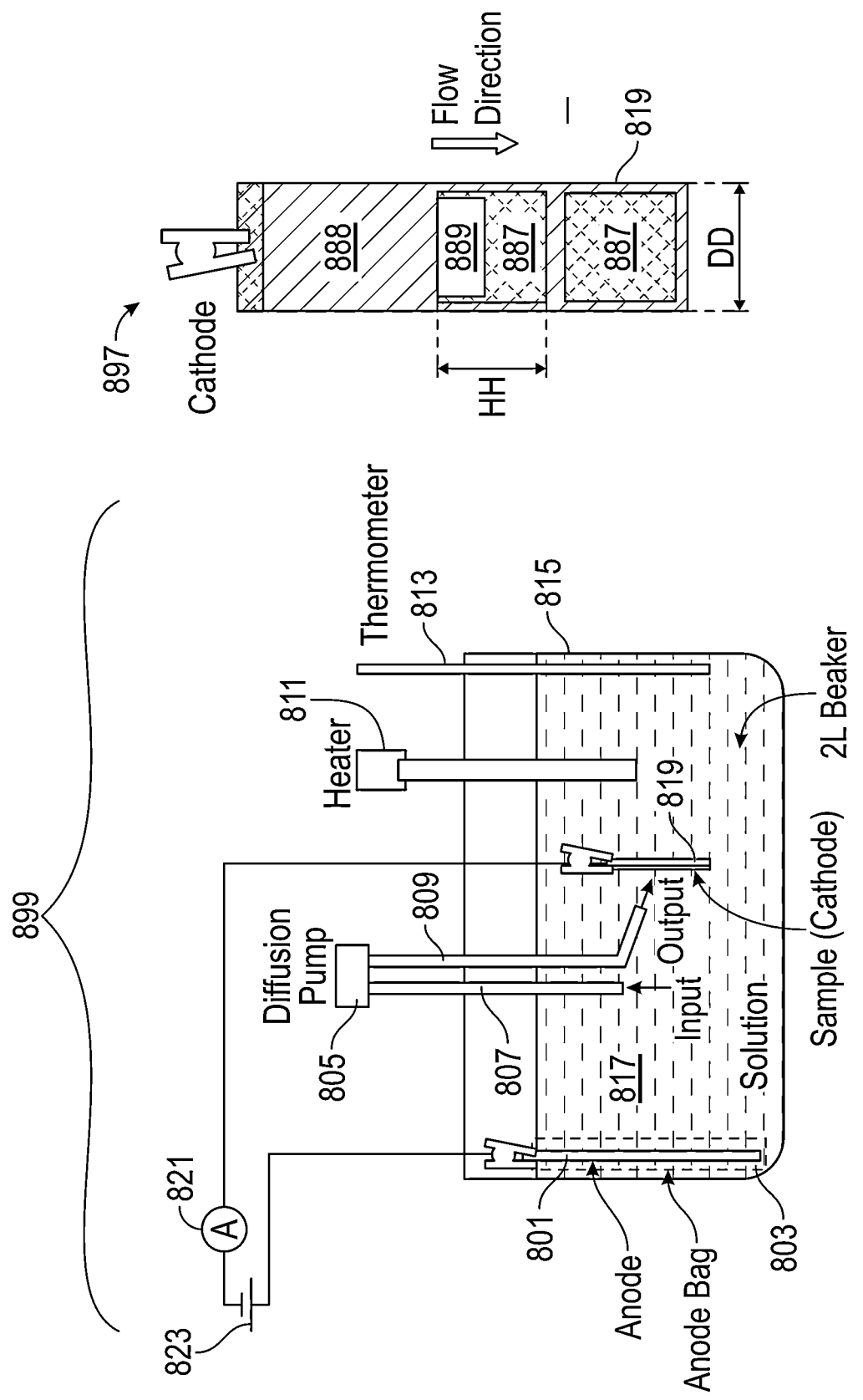
FIG. 8 shows an example setup for !plating growth in gap areas, according to aspects of the invention.
Figure 8:
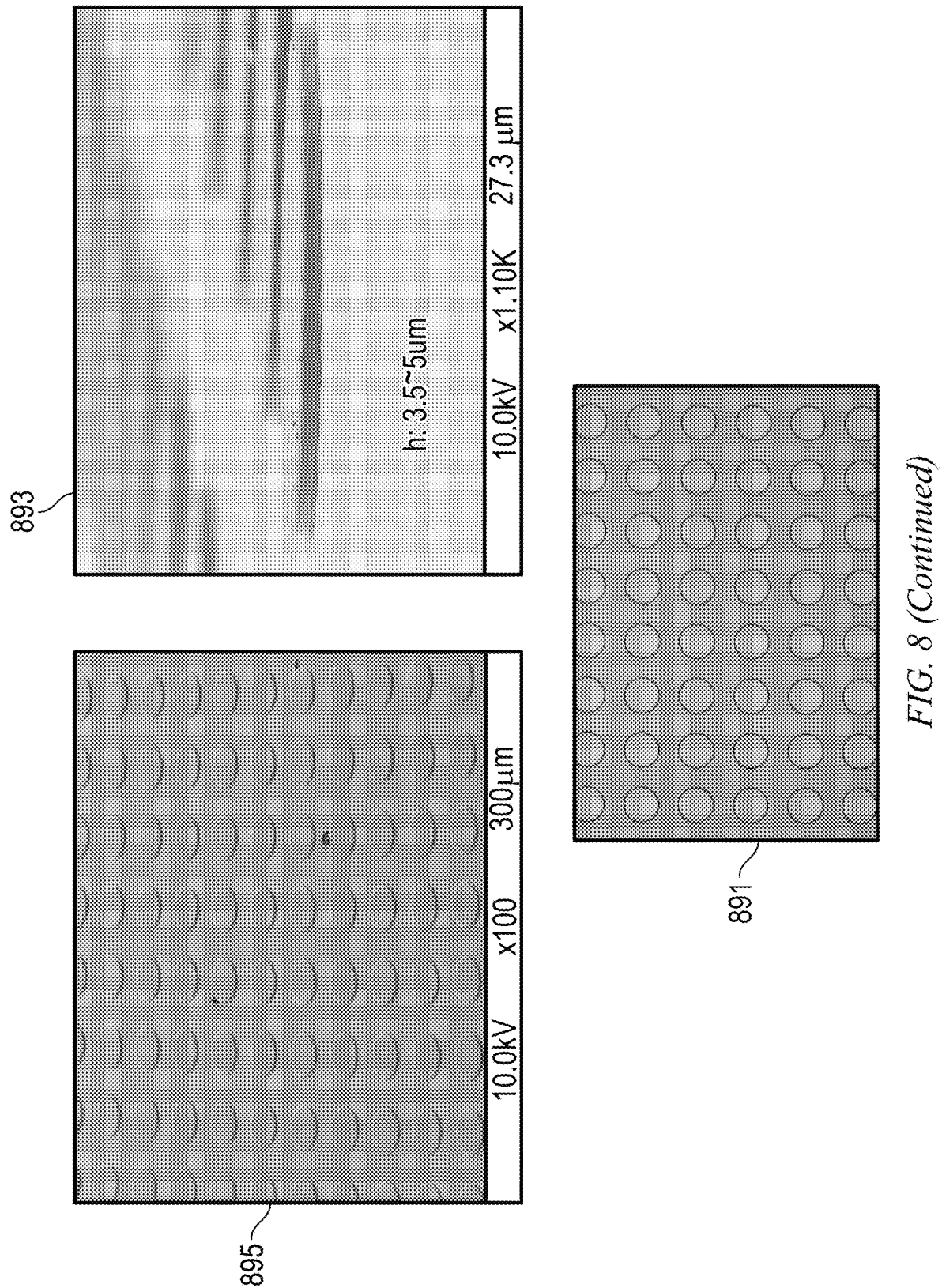

FIG. 8 shows aspects of plating growth in the gap areas. Note the example plating set-up 899, including two liter beaker 815, copper anode 801, anode bag 803, and diffusion pump 805 with input 807 and output 809. Further note heater 811, thermometer 813, solution 817, sample to be plated (cathode) 819 (shown in greater detail in view 897), ammeter 821, and voltage source 823. In a non-limiting example, dimensions DD and HH can each be about 10 μmm. Note the chip 889 (silicon shield) (for example, about 4 μmm by 8 μmm) and opening areas 887. Views 893 and 895 are side perspective and top views of the copper structures (about 3.5-5 μm high, for example). In a non-limiting example, the solution 817 is Epithas EHK-09; the sample (cathode) 819 includes Cu sputtered Si; the resist pattern is 90 μm ($D_{Cu}$) patterned, 150 μm pitch (see PITCH in FIG. 7), and the resist thickness for patterning is 10 μm; the shield chip 889 is 4×8 μmm Si; the shield gap (i.e. between the shield silicon and substrate) is 90 μm; the current density is 20 μmA/cm², the temperature is 25° C., and the time is 60 minutes.

View 891 shows the resist patterned area before electrodeposition on the areas 887 in view 897. In view 897, the area 888 is covered by resist, so the copper deposits only on the areas 887. Element 889 is a silicon shield that covers a portion of the resist-patterned area, so that solution is supplied only from the periphery of the silicon shield 889. This structure emulates the chip on substrate, and electrodeposited copper grows even in the gap (90 μm) between shield silicon 889 and the substrate of the cathode 819.

Figure 9:
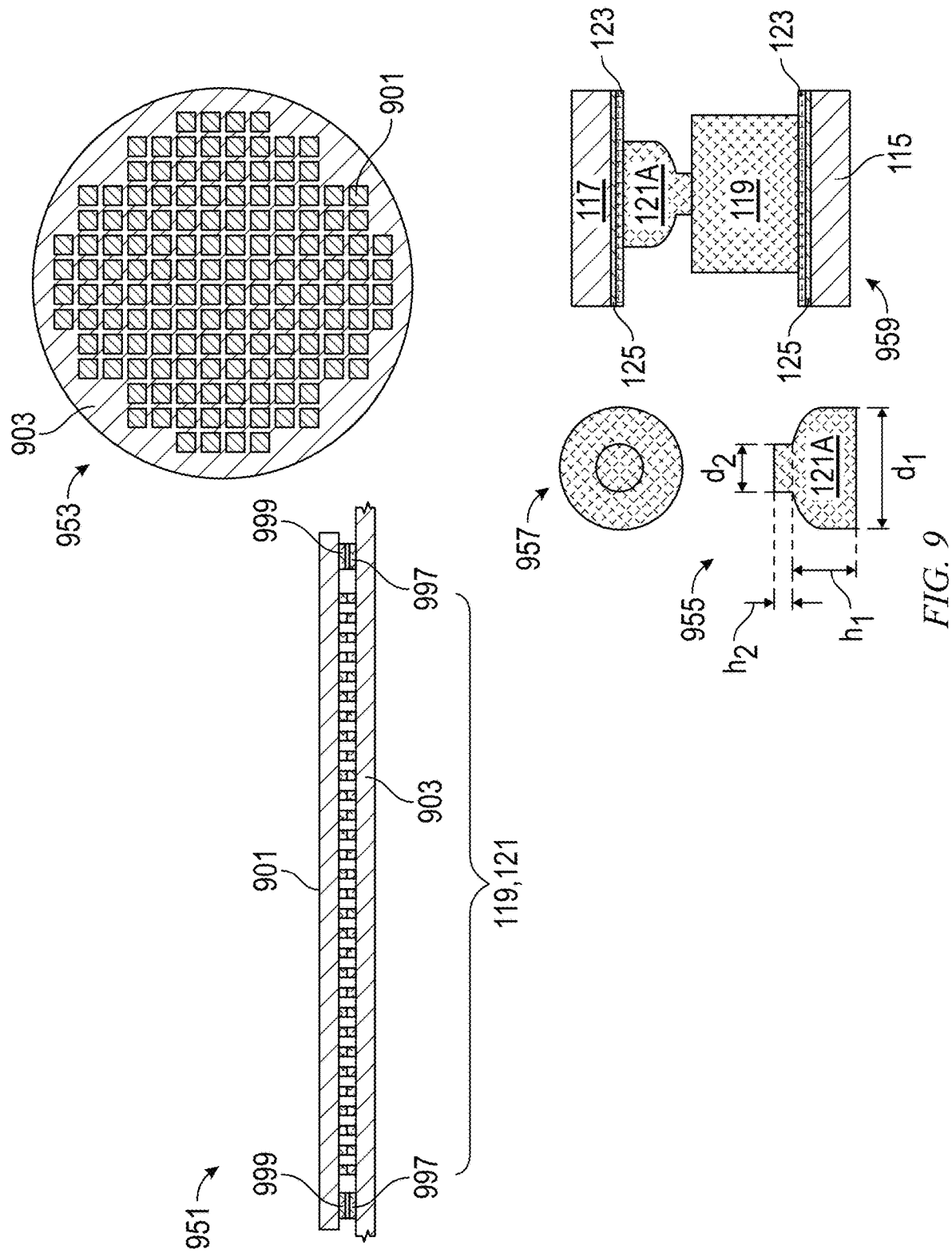
FIG. 9 shows assembly between the chip and wafer, according to aspects of the invention.

FIG. 9 shows alternative techniques for assembly between the chips 901 and the wafer 903. View 953 is a top view, view 951 is a side view of a first approach, and views 955, 957, 959 are, respectively, side, top, and side details of a second approach. In the first approach, temporarily fix the chips 901 to the wafer 903. For example, form a copper pad/pillar 997, 999 with a small height (for example, 5 μm smaller than the other copper pads/pillars, so that the height is 25 μm), and a solder or adhesive is applied to the copper pad/pillar. Thus, note these special temporary fixing pads/pillars 997, 999, different than the permanent pads/pillars 119, 121. The chips 901 are aligned to the wafer 903 using a bonding tool (familiar to the skilled artisan) and are heated to fix the adhesive at about, for example, 150-250° C. In the second approach, the permanent copper pads/pillars 119, 121 are temporarily joined using ultrasonic waves. In one or more embodiments, pillars 121A with protrusions are fabricated, and the chips are aligned and temporarily bonded to the wafer by using ultrasonic waves on the center (i.e., protrusion with smaller diameter $d_2$) of the pillars at room temperature. In a non-limiting example, $h_1$ is about 25 μm, $h_2$ is about 5 μm, $d_1$ is about 20 μm, and $d_2$ is about 8 μm.

Figure 10:
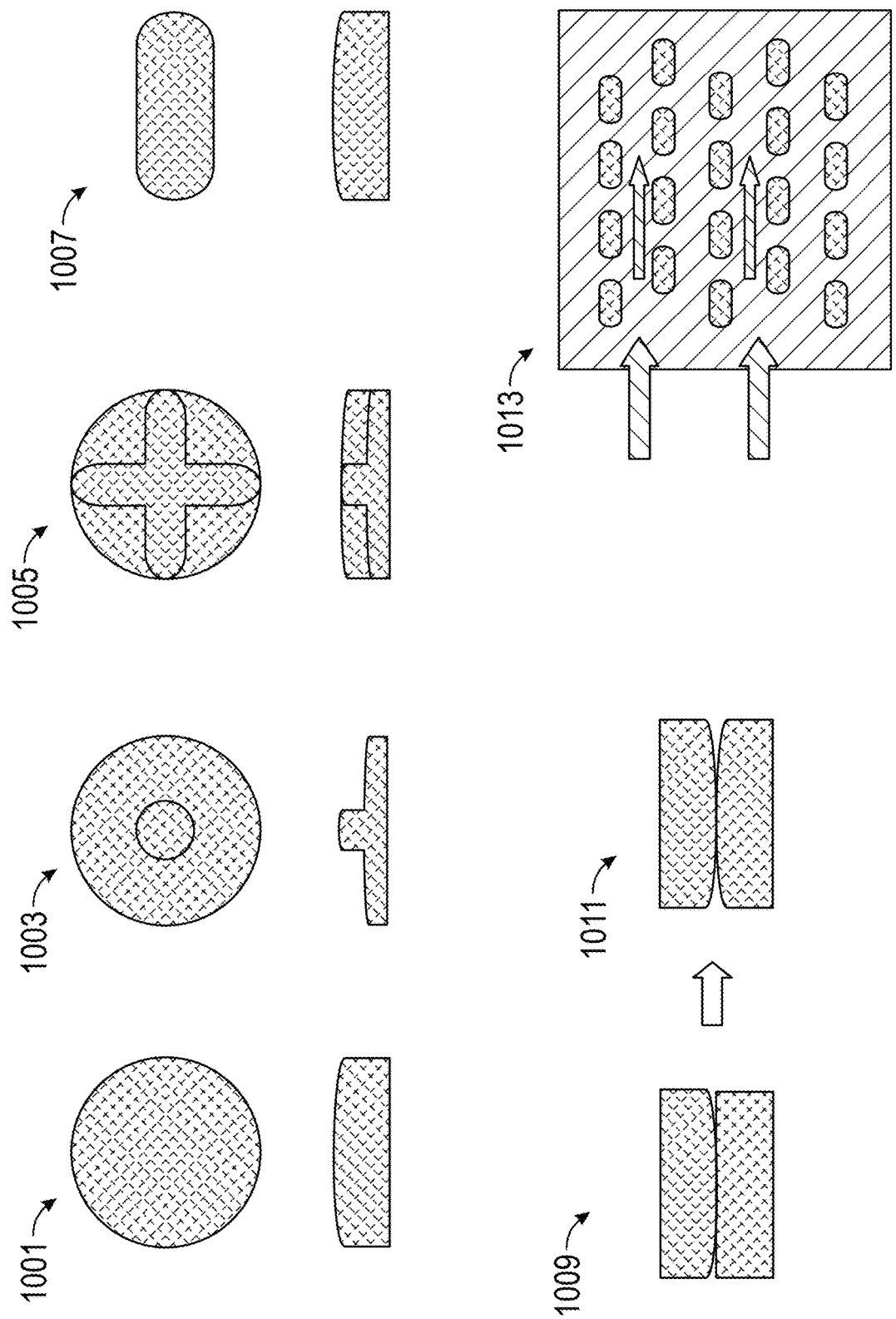
FIG. 10 shows examples of pillar/pad shapes and combinations, according to aspects of the invention.

FIG. 10 shows exemplary pad/pillar shapes and combinations of shapes. Views 1001, 1003, 1005, and 1007 are top and side views of, respectively, dome (see 121), protrusion (see 121A), cross, and elliptical embodiments. The dome shape 1001 has the advantage of being symmetrical and easy to grow uniformly. The protrusion shape of view 1003 is helpful for ultrasonic wave bonding. The cross embodiment of view 1005 provides a larger plating area, similar to via filling. The elliptical embodiment of view 1007 has the advantage of increasing the fluidity of the plating solution in a certain direction, as seen in view 1013. View 1009 shows the flat plus curved option as depicted at 119, 121 in FIGS. 1-5 above, while view 1011 shows an alternative embodiment where both sides have curvature. Advantageously, a wider gap between the copper pads/pillars is possible in this approach, which makes it easier to grow the copper plating.

Figure 11:
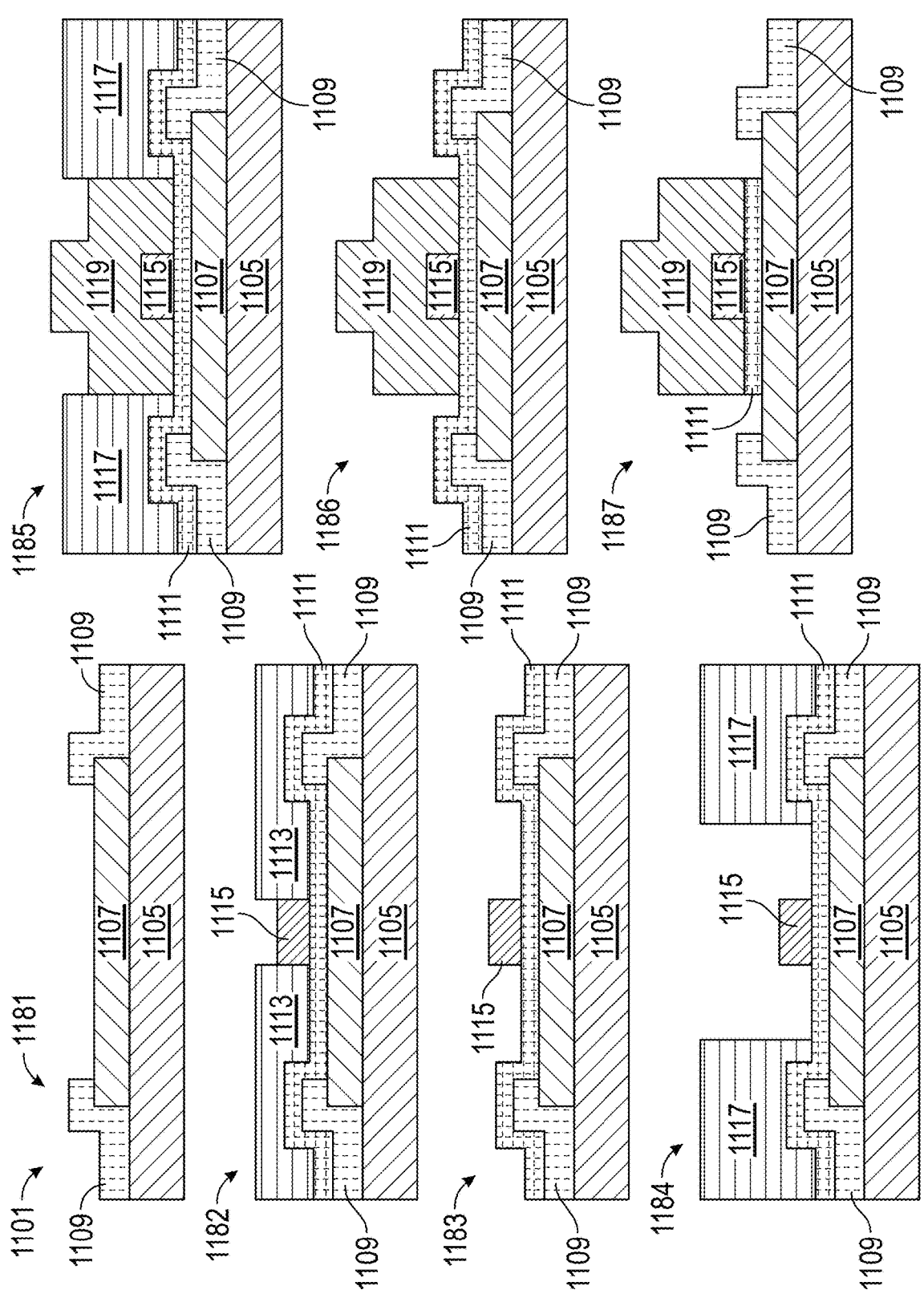
FIG. 11 shows protrusion fabrication, useful in one or more embodiments of the invention.
Figure 11:
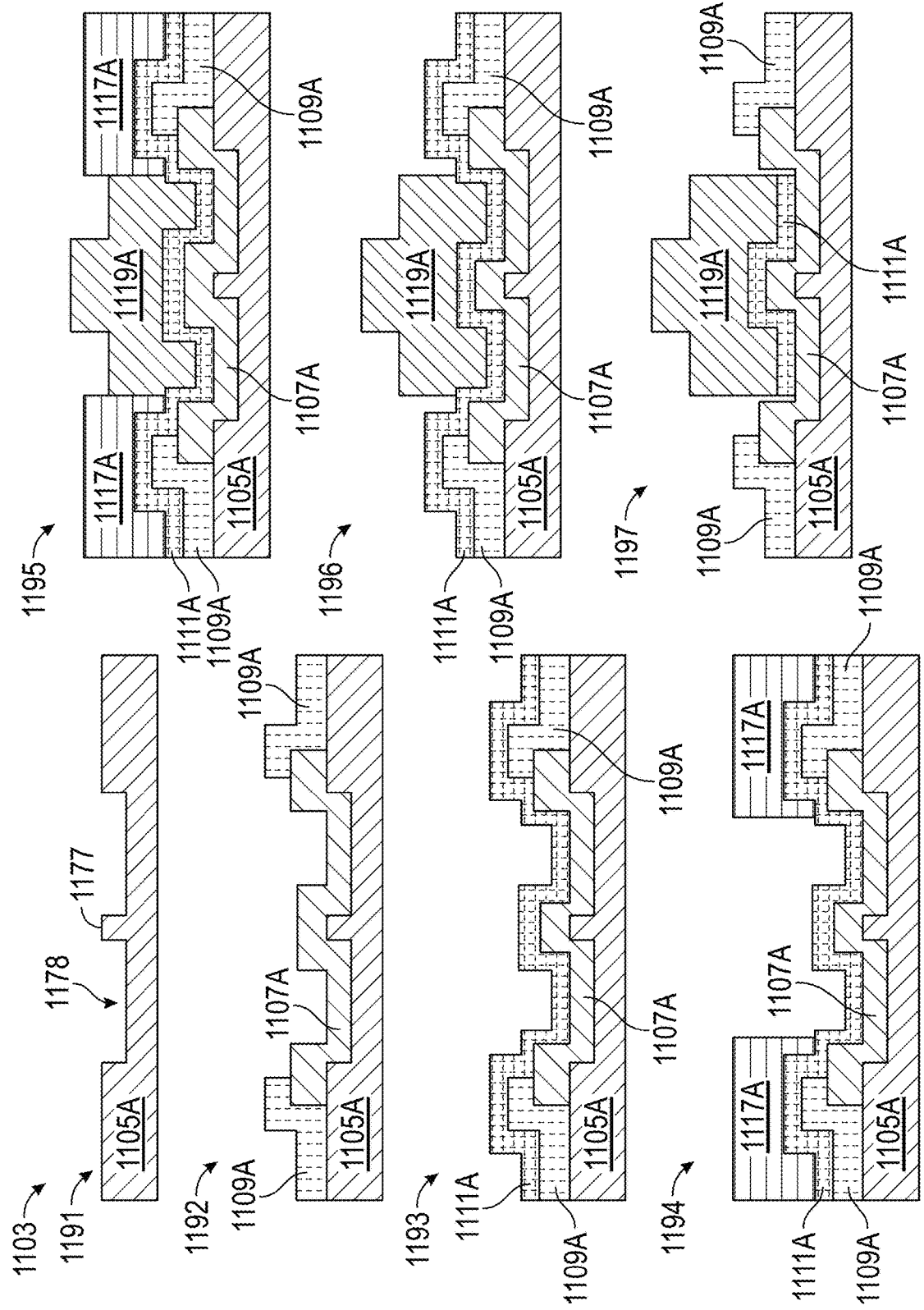

FIG. 11 shows aspects of protrusion fabrication. One of the options to fabricate a protrusion, shown in view 1101, is patterning/plating/stripping twice in the bumping process. However, this requires high-grade lithography technology (materials, tools, and processes) in bumping process to fabricate a small protrusion, especially in very fine pitch applications (<40 m). In a first step 1181, provide a dielectric 1105 with aluminum pad 1107 and passivation material 1109. In a second step 1182, deposit a seed layer 1111 (e.g., titanium and copper) and deposit and pattern a first resist 1113 and then plate with metal 1115 (e.g., copper)—the patterning and metal plating are in the desired shape such as 1003, 1005. In a third step 1183, remove the resist 1113. In a fourth step 1184, deposit and pattern a second resist 1117. In a fifth step 1185, plate with metal 1119 (e.g., copper) which will have the desired shape such as 1003, 1005 because of being plated over "bump" 1115. In a sixth step 1186, remove the resist 1117. In a seventh step 1187, etch away the seed layer 1111 except under the metal 1119.

View 1103 shows an alternative approach, forming the protrusion during the wafer fabrication process, where high-grade lithography technology is available. A via level process (or dual damascene like process) can be used. In a first step 1191, provide a dielectric 1105A with a recessed region 1178 having a protrusion 1177. The protrusion 1177 is in the desired shape such as 1003, 1005. In a second step 1192, deposit aluminum 1107A and passivation material 1109A. In a third step 1193A, deposit a seed layer 1111A (e.g., titanium and copper) and in a fourth step 1194 deposit and pattern a resist 1117A. In a fifth step 1195, plate with metal 1119A (e.g., copper) which will have the desired shape such as 1003, 1005 because of being plated over protrusion 1177. In a sixth step 1196, remove the resist 1117A. In a seventh step 1197, etch away the seed layer 1111 except under the metal 1119A.

Figure 12:
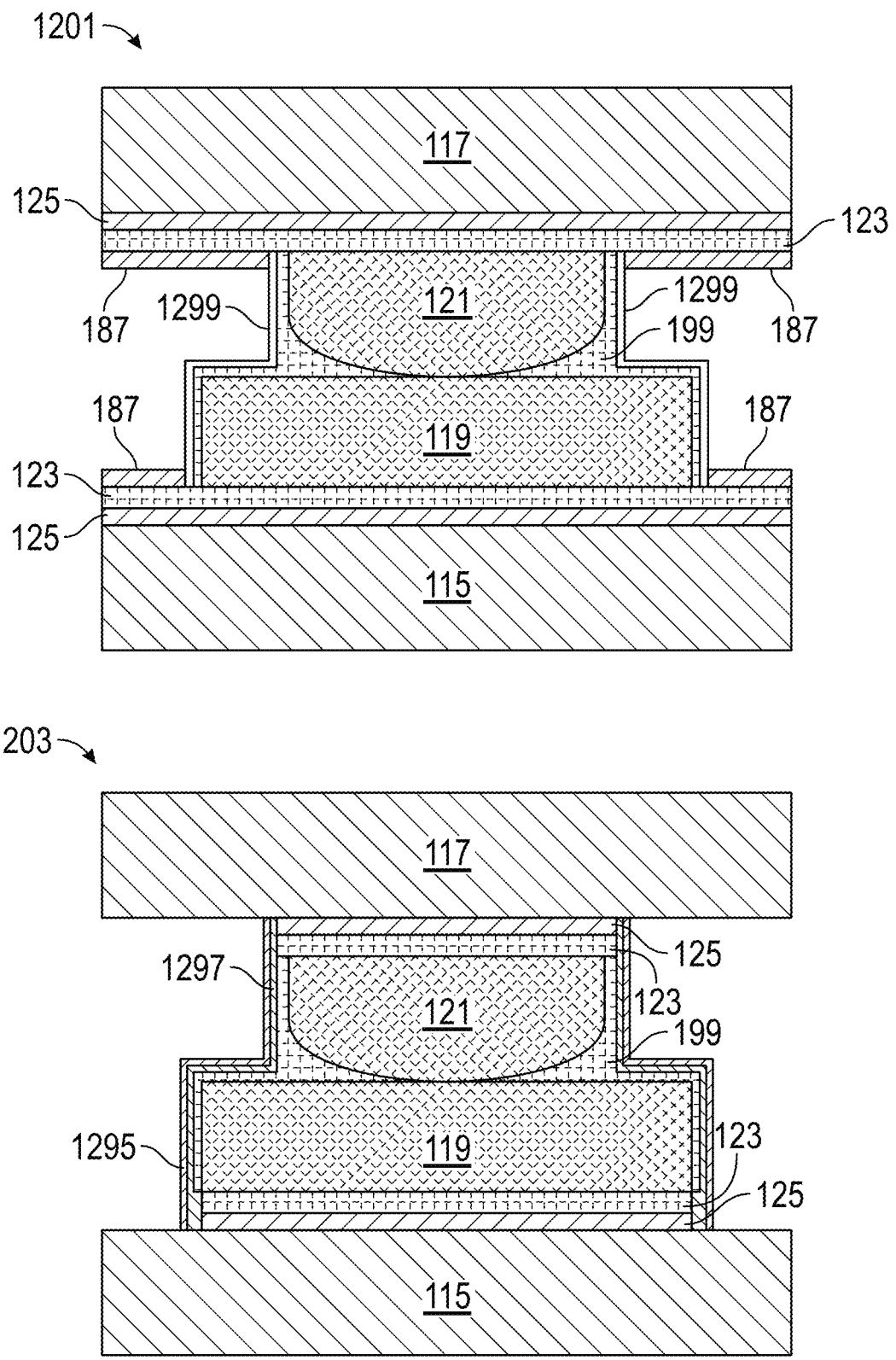
FIG. 12 shows coating of plating metal on the surface of joints, according to aspects of the invention.

FIG. 12 shows aspects of coating plating metal on the surface of joints. As seen in view 1201, after copper plating, tin plating film 1299 is formed on the surface of the copper pad joints at about 80° C., and solid phase diffusion is performed at about 150° C. to form an intermetallic compound on the surface. This helps prevent damage from stripping and etching. As seen in view 1203, after etching, electroless nickel 1297 and gold 1295 plating is fabricated on the surface of the joints at about 80° C. for nickel and about 50° C. for gold. Thus, the joints are covered by stable metal. This aspect can be employed for development into an approach such as for preventing corrosion or oxidation.

We have found that fabrication of the double resist layer and stripping of the second resist are feasible; that it is possible to etch the seed layer (copper and titanium) in the narrow gap between the chip and the wafer; and that electrodeposition metal grows even in the narrow gap area. Furthermore, uniform current density of the copper pads/pillars can be achieved by setting the position and number of cathode 819 electrodes and the position of the anode 801 electrodes. Furthermore, uniform fluidity through the copper pads/pillars can be achieved by optimization of flow rate and flow direction, chip-wafer gap control, copper pad/pillar shape, and housing of the flow path (in the example of FIG. 8, the flow path is defined by input 807 and output 809 and the shapes and locations are selected for uniform fluidity as will be appreciated by the skilled artisan).

One or more embodiments advantageously provide structures of a copper deposition layer on the joint which reduces stress concentration and undercut problems; for example, using double resist for forming copper pads/pillars and preventing growth of copper plating on the seed layer, as well as fabricating a larger resist opening diameter of the first layer as compared to the second layer, producing a structure that reduces the undercut problem.

Optionally, assembly between the chip and wafer can be facilitated by prebonding; suitable pad/pillar shapes and combinations can be employed; and/or coating of plating metal on the surface of joints can be carried out.

Figure 13:
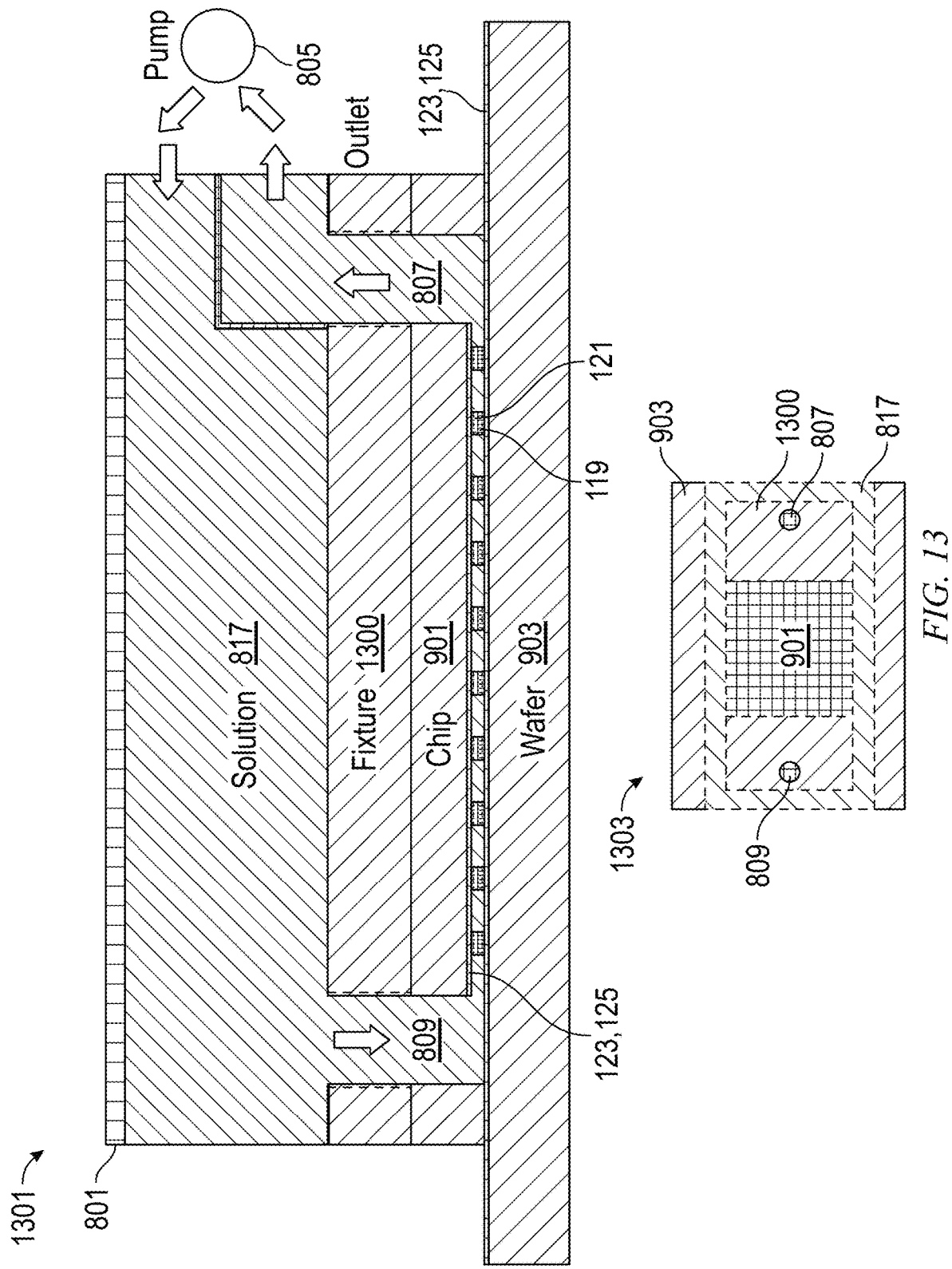
FIG. 13 shows a production fixture for electrodeposition bonding, according to aspects of the invention.

FIG. 13 shows aspects of a production set-up for electrodeposition bonding, according to an aspect of the invention. Elements analogous to those in FIG. 8 have the same reference character. View 1301 is a side view and view 1303 is a top view. Fixture 1300 holds the chip and wafer together in the solution during the electrodeposition process.

One or more embodiments thus provide a semiconductor device having a chip 901 on a substrate (wafer 903), including a pillar-shaped bump (e.g., 121) on the chip and a pad (e.g., 119) on the substrate. As shown in FIG. 5, view 501, the pillar-shaped bump and the pad are bonded by a copper layer 199 electrodeposited on the side surfaces of the pillar-shaped copper bump and the pad, and the copper layer extends around the pad on the substrate.

In another aspect, one or more embodiments provide a method for manufacturing a semiconductor device having a chip 901 on a substrate 903. The method includes providing the substrate 117; depositing a seed layer 123, 125 on a surface of the substrate; depositing a first resist layer 187 on the seed layer and patterning same; and depositing a second resist layer 189 on the patterned first resist layer to cover the patterned first resist layer. In one or more embodiments, the base area of the patterned second resist layer is larger than the base area of the patterned first resist layer. See, for example, FIG. 2A views 201-202, view 501 in FIG. 5, and FIG. 6. A further step includes depositing a copper layer (which will form pillar 121) on the seed layer without being covered by the first and second patterned layers. See FIG. 2A view 203. A still further step includes removing the second resist patterned layer 189 to form the copper pillar 121 on the substrate 117. See FIG. 2A view 204.

Another step includes providing a chip (substrate 115), forming a copper pad 119 on the chip, and aligning the copper pad and the copper pillar. See, for example, view 205 in FIG. 2A. A further step includes electrodepositing a copper layer 199 on side surfaces of the copper pad 121 and the copper pillar 119 and on the exposed seed layer 123, so that the copper pad and the copper pillar are bonded. Still another step includes removing the first resist patterned layer. See view 207 in FIG. 2A. Yet another step includes removing the seed layer. See view 208 in FIG. 2A.

In one or more embodiments, the pillars on the chip are formed in an essentially analogous manner to the pads on the substrate. As noted, curved or flat posts/pillars are made by using different electrodeposition solutions in a manner known to the skilled artisan. Thus, forming the copper pillar on the chip includes, in step 201A, depositing a seed layer 123, 125 on a surface of the chip 115; in step 202A, depositing a third resist layer 187 on the seed layer and patterning same; and depositing a fourth resist layer 189 on the patterned third resist layer to cover the patterned third resist layer. In one or more embodiments, the base area of the patterned fourth resist layer is larger than the base area of the patterned third resist layer. See, for example, FIG. 2B views 201A-202A, view 501 in FIG. 5, and FIG. 6, wherein the third and fourth resist layers are represented by the first and second resist layers, respectively.

Additional steps in forming the copper pillar on the chip include depositing a copper layer (which will form 119) on the seed layer without being covered by the third and fourth patterned layers (FIG. 2B view 203A), and removing the fourth resist patterned layer to form the copper pillar 119 on the chip (FIG. 2B view 204A).

One or more embodiments thus provide double mask resists used for electrodeposition bonding. In an exemplary method, the first thin resist layer is coated and the second thick resist layer is provided with a smaller opening diameter than the first one. This can advantageously result in a gap between the copper pillar/pad and the first resist after the second resist is stripped.

In one or more embodiments, only the first resist is remaining when electrodeposition is conducted, advantageously preventing depositing metal on the seed layer. Metal is also deposited on the gap between the copper pillar/pad and the first resist, and the contact area of copper pillar/pad is expanded. It is thus possible to solve the problem of reducing the contact area of the copper pillar/pad due to the undercut when the seed layer is etched, by using this structure.

Optionally, it is possible to carry out prebonding for assembly of the chip and wafer before electrodeposition, which makes current flow on the chip side, and stabilizes the assembly. Various configurations are possible for the copper pillar/pad structure and the combination of the chip side and the wafer side. Exemplary copper pillar/pad shapes include, for example, dome and convex, cross and ellipse, and the like. One or more embodiments are useful for providing uniform and/or speedy growth. One or more embodiments coat plating metal on the surface of joints, and/or are effective for the stability of the joints.

Consider double resist fabrication and electrodeposition bonding techniques. In one or more embodiments, there are two steps for this fabrication. First, a thin resist (the first resist) is coated on the wafer and patterned, and then the thick resist (the second resist) is coated and patterned. The location of the opening is the same between the first resist and the second one, but the opening diameter of the second resist is smaller than that of the first resist. After the copper pillars are fabricated and the second resist is stripped, the chip and wafer with the first resist are assembled, and electrodeposition is conducted. By providing the gap between the copper pillar/pad and the first resist, the contact area of the copper pillar/pad is expanded because the metal is also deposited on the gap.

Consider again the prebonding process, which, as noted, can employ a solder bump or resin on the dummy pad/pillar of the wafer/chip or using ultrasonic wave bonding (see FIG. 9).

Regarding the copper pillar/pad structure, the copper pillar/pad shape can be controlled by the mask resist shape and in some cases, by the copper pillar/pad growing in several steps. That is to say, first, a small opening is patterned by photoresist and first electrodeposition is conducted. After removing the photoresist, the double resist is patterned. The second opening is larger than the first one.

Next, the second electrodeposition is conducted. This process is related to FIG. 11 and the special pillar/pad shape like 1003 or 1005 is fabricated.

Regarding stabilization of the surfaces of the joints, tin plating or nickel and gold plating are useful for stability of the joint surface because tin and copper form a stable intermetallic compound and gold is a stable metal.

In a non-limiting example, the wafer 903 (=115 plus 125 plus 123) has the flat-topped copper structures 119 which are called pads, and that the chips 901 (=117 plus 125 plus 123) have the rounded copper structures 121 that are called pillars; however, which shapes are associated to which of the chips and the wafer can vary in other embodiments.

Accordingly, given the discussion thus far, it will be appreciated that in one aspect, an exemplary semiconductor structure includes a wafer (e.g., 115 plus 123, 125; 903) having a wafer outer surface; a semiconductor chip (e.g., 117 plus 123, 125; 901); and a plurality of copper pillars 121 on the semiconductor chip. The pillars have pillar end portions and pillar outside surfaces (i.e., the sides of 121). Also included are a plurality of copper pads 119 on the wafer. The pads have pad end portions aligned with the pillar end portions, and the pillar end portions and the pad end portions of the plurality of copper pads define a plurality of bonding material receiving regions (i.e., region between 121 and 119 seen in view 399 of FIG. 3; includes circle delineating view 301). The pads have pad outside surfaces (i.e., the sides of 119). At least one of the pillar end portions and the pad end portions are curved. Also included is a copper bonding layer 199 on the pillar outside surfaces, the pad outside surfaces, the bonding material receiving regions, and on portions of the outer surface of the wafer. The portions of the outer surface of the wafer surround the copper pads when viewed in plan (see view 501 in FIG. 5 (side view); in view 599 see, e.g., the annular region (between 119 or 121 and resist 187) filled with material 199.

In some instances, the pillar end portions are curved and the portions of the outer surface of the wafer have, as noted, an annular shape about the copper pads when viewed in plan (view 599).

In one or more embodiments, the wafer includes a wafer substrate 115 and a wafer seed layer 123, 125 on the wafer substrate. The wafer seed layer forms the wafer outer surface, and the copper pads are formed on the wafer seed layer.

In some instances, the chip includes a chip substrate 117 and a chip seed layer 123, 125 on the chip substrate. The copper pillars are formed on the chip seed layer. In some such cases, the wafer seed layer and the chip seed layer each include an inner titanium layer 125 and an outer copper layer 123. Referring to view 525, in some such cases, at least a portion of the wafer seed layer (e.g., the titanium part) is recessed under the copper bonding layer but is not recessed under the copper pads.

In one or more embodiments, the copper pads have a larger diameter than the copper pillars; however, a variety of different combinations of pad/pillar shapes and diameters can be employed.

In some instances, the copper bonding layer includes fillets 311 adjacent to the bonding material receiving regions when viewed in cross section and radially outward thereof when viewed in plan; in view 599 see 311.

Advantageously, in one or more embodiments, the copper bonding layer does not have a scallop shape 313 adjacent to the bonding material receiving regions when viewed in cross section.

Referring to FIG. 10, as appropriate, the plurality of copper pillars can have cylindrical protrusions outward of the curved end portions as seen in view 1003 or cross-shaped protrusions outward of the curved end portions as seen in view 1005, for example. In another aspect, as seen in view 1007, the plurality of copper pillars can have elliptical cross sections when viewed in plan, it being understood that elliptical pillars do not strictly speaking have a "diameter" but the elliptical outline in the resist will be larger for one resist than the other, analogous to structures with round cross sections.

As seen in view 1011, in some cases, both the pillar end portions and the pad end portions are curved. Further, special shapes as seen in FIG. 10 could be employed on posts.

Referring to view 953, one or more embodiments typically include a plurality of additional semiconductor chips 901, each configured as described. That is, the additional chips include an additional plurality of copper pillars on the plurality of additional semiconductor chips; the additional plurality of copper pillars have pillar end portions and pillar outside surfaces. Further, there are an additional plurality of copper pads on the wafer (to receive the additional chips). The additional plurality of copper pads have pad end portions aligned with the pillar end portions of the additional plurality of copper pillars on the plurality of additional semiconductor chips, and the pillar end portions of the additional plurality of copper pillars and the pad end portions of the additional plurality of copper pads define an additional plurality of bonding material receiving regions. The additional plurality of copper pads have pad outside surfaces, and at least one of the pillar end portions of the additional plurality of copper pillars and the pad end portions of the additional plurality of copper pads are curved. The copper bonding layer is also present on the pillar outside surfaces of the additional plurality of copper pillars, the pad outside surfaces of the additional plurality of copper pads, the additional bonding material receiving regions, and an additional portion of the outer surface of the wafer (in turn surrounding the additional plurality of copper pads when viewed in plan).

In another aspect, referring to FIGS. 2A-2B, consider an exemplary method of forming a semiconductor structure. Note that it does not matter in what order pads 119 on the wafer or pillars 121 on the chips are formed and, in the following, generic reference is made to substrates and copper structures. The method includes providing a first substrate 117 or 119; providing a first seed layer 123, 125 on an outer surface of the first substrate (see steps 201, 201A); forming a patterned first resist layer 187 on the first seed layer; and forming a patterned second resist layer 189 on the patterned first resist layer (see steps of views 202, 202A). When viewed in plan, the first resist layer and the second resist layer have aligned openings, and the openings in the second resist layer (spaces between 189 in views 202, 202A) are smaller than the openings in the first resist layer (spaces between 187 in views 202, 202A). Further steps include depositing copper (to form 119 or 121) onto the first seed layer in the openings in the second resist layer (steps 203, 203A); removing the second resist layer to reveal the deposited copper as a plurality of first copper structures (119 or 121); providing a second substrate (the other of 117, 119) with a plurality of second copper structures (the other of 119 or 121, as seen in steps 204, 204A); and aligning the first copper structures with the second copper structures as per step 205. Still a further step 206 includes electrodepositing a copper layer 199 on outside surfaces of the first copper structures, outside surfaces of the second copper structures, bonding material receiving regions defined between the aligned first and second copper structures, and portions of the first seed layer on the outer surface of the first substrate. As seen in view 599, these portions surround (e.g., have an annular shape about) the copper first copper structures when viewed in plan, and when the annular shape is present, it is defined by the difference in size between the openings in the first and second resist layers.

In some instances, providing the second substrate (the other of 115, 117) with the plurality of second copper structures (the other of 119 or 121) includes providing the second substrate without the plurality of second copper structures; providing (the other of step 201, 201A) a second seed layer 123, 125 on an outer surface of the second substrate; forming a patterned third resist layer on the second seed layer; and forming a patterned fourth resist layer on the patterned third resist layer (the other of steps 202, 202A). When viewed in plan, the third resist layer and the fourth resist layer have aligned openings, and the openings in the fourth resist layer (space between 189 in views 202, 202A) are smaller than the openings in the third resist layer (space between 187 in views 202, 202A). Further steps include depositing (the other of 203, 203A) copper onto the second seed layer in the openings in the fourth resist layer; and removing (the other of 204, 204A) the fourth resist layer to reveal the deposited copper as the plurality of second copper structures.

In one or more embodiments, in the step of removing the second resist layer to reveal the first deposited copper as a plurality of first copper structures, the plurality of first copper structures include flat pads 119; and in the step of removing the fourth resist layer to reveal the second deposited copper as the plurality of second copper structures, the plurality of second copper structures include pillars 121 with curved end portions.

In some instances, in the step of providing the first seed layer, the first seed layer includes a first seed layer inner titanium layer 125 and a first seed layer outer copper layer 123; and in the step of providing the second seed layer, the second seed layer includes a second seed layer inner titanium layer 125 and a second seed layer outer copper layer 123.

Referring to FIG. 9, one or more embodiments further include, prior to the electrodepositing of the copper layer on the outside surfaces of the first copper structures, temporarily affixing the first and second substrate via at least one of soldering of, and adhesive application on, corresponding temporary fixing structures 997, 999. One or more embodiments further include, prior to the electrodepositing of the copper layer on the outside surfaces of the first copper structures, temporarily affixing the first and second substrate via ultrasonic bonding (see view 959) of the aligned first and second copper structures. Some embodiments include, for example, forming protrusions (see views 1003, 1005) on at least one of the first copper structures and the second copper structures, prior to the ultrasonic bonding.

In a further aspect, a hardware description language (HDL) design structure is encoded on a machine-readable data storage medium. The HDL design structure includes elements that when processed in a computer-aided design system generate a machine-executable representation of at least a portion of a semiconductor structure, as described.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

Figure 14:
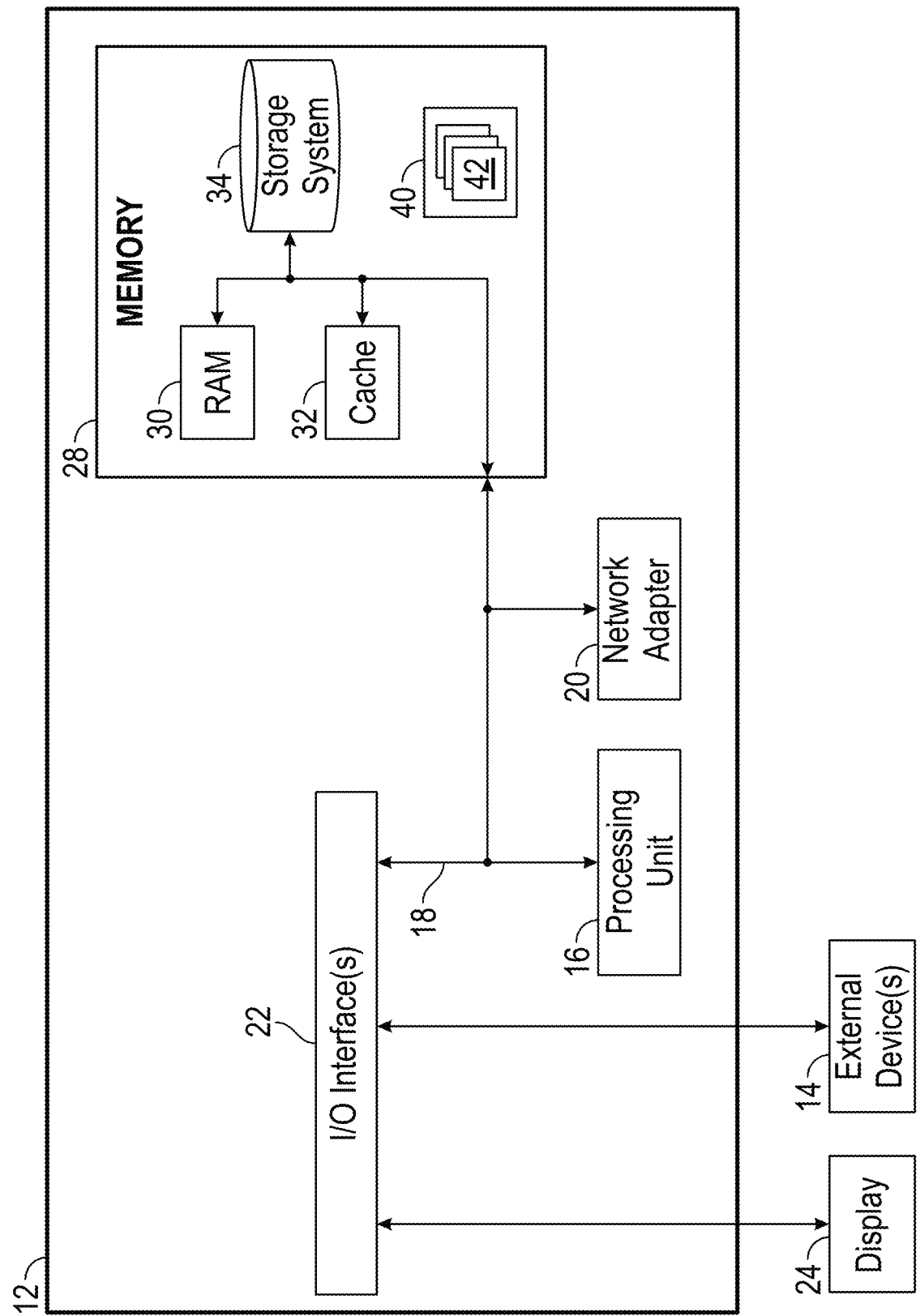
FIG. 14 depicts a computer system that could implement a design process such as that shown in FIG. 15.

Some aspects of the invention, or elements thereof, can be implemented in the form of an apparatus including a memory and at least one processor that is coupled to the memory and operative to perform exemplary method steps. FIG. 14 depicts a computer system that may be useful in implementing one or more aspects and/or elements of the invention; it is referred to herein as a cloud computing node but is also representative of a server, general purpose-computer, etc. which may be provided in a cloud or locally. Note that such a computer can control semiconductor design and/or fabrication.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software (e.g., for semiconductor design and/or fabrication) running on a general purpose computer or workstation. With reference to FIG. 14, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory)

30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 14) running a server program. It will be understood that such a physical server may or may not include a display and keyboard.

Figure 15:
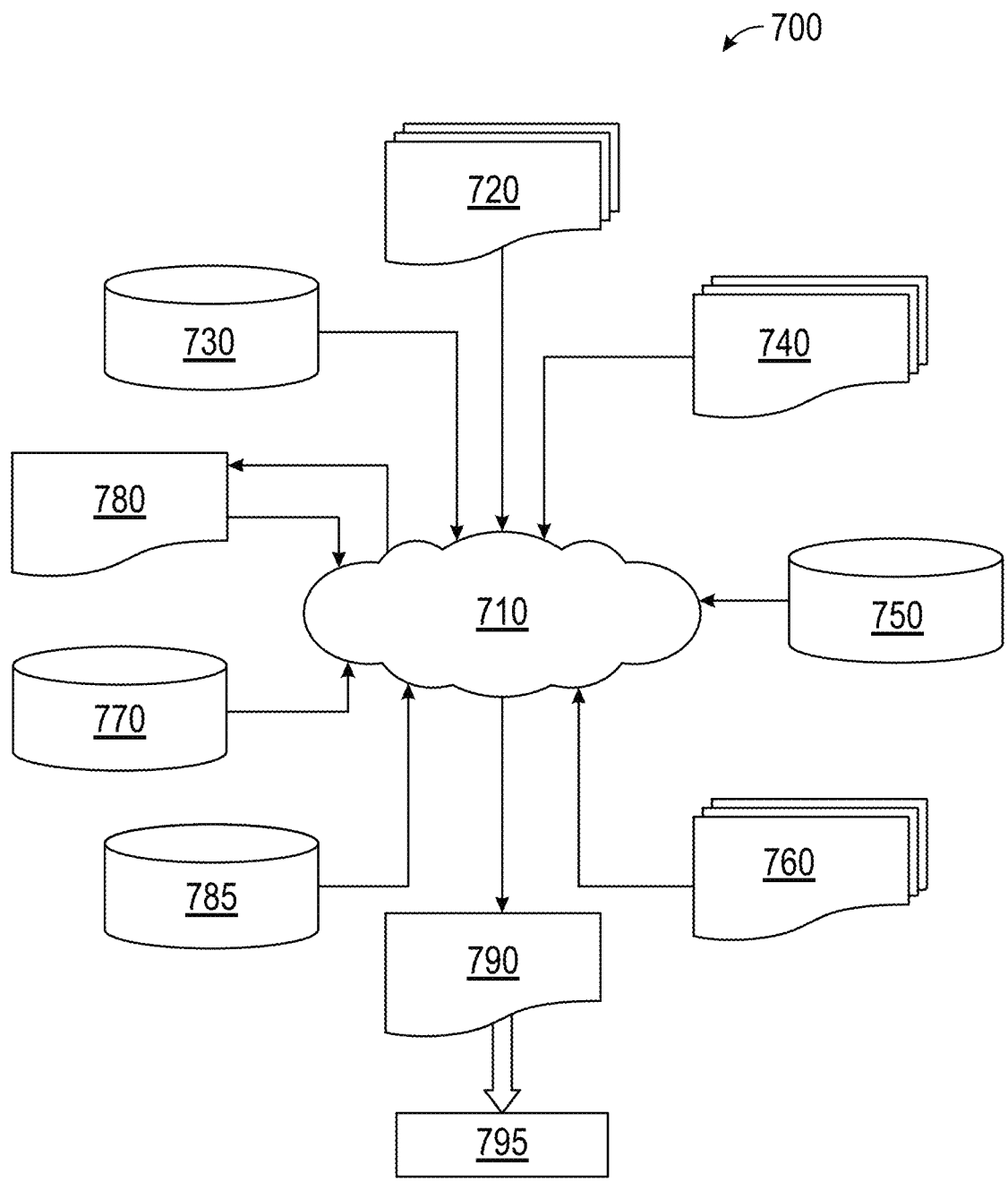
FIG. 15 is a flow diagram of a design process used in semiconductor design, manufacture, and/or test.

It should be noted that any of the methods described herein can include an additional step of providing a system comprising distinct software modules embodied on a computer readable storage medium; the modules can include, for example, any or all of the appropriate elements depicted in FIG. 15. The method steps can then be carried out using the distinct software modules and/or sub-modules of the system, as described herein, executing on one or more hardware processors such as 16. Further, a computer program product can include a computer-readable storage medium with code adapted to be implemented to carry out one or more method steps described herein, including the provision of the system with the distinct software modules. In one or more embodiments, the computer readable storage medium embodying code and/or design structure, is non-transitory.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary Design Process Used in Semiconductor Design, Manufacture, and/or Test

One or more embodiments make use of computer-aided semiconductor integrated circuit design simulation, test, layout, and/or manufacture. In this regard, FIG. 15 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
   a wafer having a wafer outer surface;
   a plurality of copper pillars on a semiconductor chip, the plurality of copper pillars having pillar end portions and pillar outside surfaces;
   a plurality of copper pads on the wafer, the plurality of copper pads having pad end portions aligned with and directly contacting the pillar end portions, the pillar end portions and the pad end portions of the plurality of copper pads defining a plurality of bonding material receiving regions, the plurality of copper pads having pad outside surfaces, at least one of the pillar end portions and the pad end portions being curved; and
   a copper bonding layer on the pillar outside surfaces, the pad outside surfaces, the bonding material receiving regions, and portions of the outer surface of the wafer, the portions of the outer surface of the wafer surrounding the plurality of copper pads when viewed in plan.

2. The semiconductor structure of claim 1, wherein the pillar end portions are curved and the portions of the outer surface of the wafer have an annular shape about the plurality of copper pads when viewed in plan.

3. The semiconductor structure of claim 2, wherein the wafer includes a wafer substrate and a wafer seed layer on the wafer substrate, the wafer seed layer forming the wafer outer surface, the plurality of copper pads being located on the wafer seed layer.

4. The semiconductor structure of claim 3, wherein the chip includes a chip substrate and a chip seed layer on the chip substrate, the plurality of copper pillars being located on the chip seed layer.

5. The semiconductor structure of claim 4, wherein the wafer seed layer and the chip seed layer each include an inner titanium layer and an outer copper layer.

6. The semiconductor structure of claim 5, wherein at least a portion of the wafer seed layer is recessed under the copper bonding layer but is not recessed under the plurality of copper pads.

7. The semiconductor structure of claim 2, wherein the plurality of copper pads have a larger diameter than the plurality of copper pillars.

8. The semiconductor structure of claim 7, wherein the copper bonding layer includes fillets adjacent to the bonding material receiving regions when viewed in cross section and radially outward thereof when viewed in plan.

9. The semiconductor structure of claim 8, wherein the copper bonding layer does not have a scallop shape adjacent to the bonding material receiving regions when viewed in cross section.

10. The semiconductor structure of claim 2, wherein the plurality of copper pillars have cylindrical protrusions outward of the curved pillar end portions.

11. The semiconductor structure of claim 2, wherein the plurality of copper pillars have cross-shaped protrusions outward of the curved end portions.

12. The semiconductor structure of claim 1, wherein the plurality of copper pillars have elliptical cross sections when viewed in plan.

13. The semiconductor structure of claim 1, wherein both the pillar end portions and the pad end portions are curved.

14. The semiconductor structure of claim 1, further comprising:
   a plurality of additional semiconductor chips;
   an additional plurality of copper pillars on the plurality of additional semiconductor chips, the additional plurality of copper pillars having additional pillar end portions and additional pillar outside surfaces; and
   an additional plurality of copper pads on the wafer, the additional plurality of copper pads having additional pad end portions aligned with the additional pillar end portions of the additional plurality of copper pillars on the plurality of additional semiconductor chips, the additional pillar end portions of the additional plurality of copper pillars and the additional pad end portions of the additional plurality of copper pads defining an additional plurality of bonding material receiving regions, the additional plurality of copper pads having additional pad outside surfaces, at least one of the additional pillar end portions of the additional plurality of copper pillars and the additional pad end portions of the additional plurality of copper pads being curved;
   wherein the copper bonding layer is also present on the additional pillar outside surfaces of the additional plurality of copper pillars, the additional pad outside surfaces of the additional plurality of copper pads, the additional bonding material receiving regions, and additional portions of the outer surface of the wafer, the additional portions surrounding the additional plurality of copper pads when viewed in plan.

16. The semiconductor structure of claim 1, wherein the copper bonding layer is disposed directly on the pad outside surfaces.

16. The semiconductor structure of claim 1, wherein the copper bonding layer is disposed directly on both the pillar outside surfaces and the pad outside surfaces.

\* \* \* \* \*